US 7,218,108 B2

(12) United States Patent
Ichinose et al.

(10) Patent No.: US 7,218,108 B2
(45) Date of Patent: May 15, 2007

(54) MAGNETIC RESONANCE IMAGING APPARATUS AND PROCESSING METHOD FOR MAGNETIC RESONANCE IMAGING COLLECTION DATA

(75) Inventors: Nobuyasu Ichinose, Otawara (JP); Yoshio Machida, Nasu-Gun (JP); Hitoshi Kanazawa, Utsunomiya (JP); Shinichi Uchizono, Nasu-Gun (JP)

(73) Assignees: Kabushiki Kaisha Toshiba, Tokyo (JP); Toshiba Medical Systems Corporation, Otawara-shi, Tochigi-Ken (JP)

( * ) Notice: Subject to any disclaimer, the term of this patent is extended or adjusted under 35 U.S.C. 154(b) by 3 days.

(21) Appl. No.: 11/033,508

(22) Filed: Jan. 12, 2005

(65) Prior Publication Data

US 2005/0151538 A1 Jul. 14, 2005

(30) Foreign Application Priority Data

Jan. 13, 2004 (JP) .............................. 2004-005868

(51) Int. Cl.
*G01V 3/00* (2006.01)

(52) U.S. Cl. ........................ 324/309; 324/307; 600/410
(58) Field of Classification Search ................ 324/309, 324/307; 600/410
See application file for complete search history.

(56) References Cited

U.S. PATENT DOCUMENTS

| 5,166,875 A | 11/1992 | Machida |
| 5,275,164 A | 1/1994 | Maeda et al. |
| 5,713,358 A | 2/1998 | Mistretta et al. |
| 5,881,728 A | 3/1999 | Mistretta et al. |
| 6,650,925 B2 * | 11/2003 | Wang .......................... 600/410 |
| 6,949,928 B2 * | 9/2005 | Gonzalez Ballester et al. ........................... 324/307 |
| 2003/0132750 A1 | 7/2003 | Machida |

OTHER PUBLICATIONS

U.S. Appl. No. 10/841,963, filed May 8, 2003.
J.W. Carlson, "Imaging Time Reduction through Multiple Receiver Coil Data Acquisition and Image Reconstruction", MRM 29:681-688 (1993).
K. Pruessmann, "SENSE: Sensitivity Encoding for Fast MRI", Magnetic Resonance in Medicine 42:952-962 (1999).
D. Sodickson, "Simultaneous Acquisition of Spatial Harmonics (SMASH): Fast Imaging with Radiofrequency Coil Arrays", MRM 38:591-603 (1997).
J.B. Ra, "Fast Imaging Using Subencoding Data Sets from Multiple Detectors", MRM 30:142-145 (1993).

* cited by examiner

*Primary Examiner*—Louis M. Arana
(74) *Attorney, Agent, or Firm*—Nixon & Vanderhye P.C.

(57) ABSTRACT

A magnetic resonance imaging apparatus includes: a sensitivity map database that stores sensitivity map data of a multi-coil including plural coils necessary for parallel imaging unfolding processing; a data slicing unit that slices partial data from three-dimensional volume data collected for the respective coils by parallel imaging, respectively; an intermediate image reconstructing unit that executes reconstruction processing for the partial data to thereby reconstruct intermediate images for the respective coils; and a reference image generating unit that slices sensitivity map data corresponding to the intermediate images from the sensitivity map database as sensitivity map data for unfolding processing, executes the parallel imaging unfolding processing for the intermediate images using the sensitivity map data for unfolding processing, and generates reference images.

25 Claims, 14 Drawing Sheets

US 7,218,108 B2

MAGNETIC RESONANCE IMAGING APPARATUS AND PROCESSING METHOD FOR MAGNETIC RESONANCE IMAGING COLLECTION DATA

BACKGROUND OF THE INVENTION

1. Field of the Invention

The present invention relates to a magnetic resonance imaging apparatus and a processing method for magnetic resonance imaging (MRI) collection data that reconstruct images of an object using a nuclear magnetic resonance signal, which is generated by magnetic resonance of an atomic nuclear spin in the subject. In particular, the invention relates to a magnetic resonance imaging apparatus and a processing method for an MRI data collection that quickly displays confirmation images for confirming the usefulness of collected parallel imaging (PI) MRI data prior to the lengthy process required for complete MRI processing of the PI MRI data.

2. Background

Conventionally, as a monitoring apparatus at a medical treatment site, a magnetic resonance imaging (MRI) apparatus 1 as shown in FIG. 12 is used (see, for example, JP-A-2003-334177).

The MRI apparatus 1 is an apparatus that forms gradient magnetic fields in X axis, Y axis, and Z axis directions using respective gradient magnetic field coils 3x, 3y, and 3z of a gradient magnetic field coil unit 3 in an imaging area of a patient P, who is set in a cylindrical magnet for static magnetic field 2 forming a static magnetic field, and transmits an RF signal of a Larmor frequency from a radio frequency (RF) coil 4 to thereby cause an atomic nuclear spin in the patient P to magnetically resonate and reconstruct images of the patient P using a nuclear magnetic resonance (NMR) signal generated by excitation.

In short, a static magnetic field is formed inside the magnet for static magnetic field 2 by a static magnetic field power supply 5 in advance. Then, according to an instruction from an input device 6, a sequence controller control unit 7 gives a sequence, which is control information for a signal, to a sequence controller 8. The sequence controller 8 controls a transmitter 10, which gives an RF signal to a gradient magnetic field power supply 9 connected to the respective gradient magnetic field coils 3x, 3y, and 3z and the RF coil 4, in accordance with the sequence. Consequently, a gradient magnetic field is formed in the imaging area and the RF signal is transmitted to the patient P.

In this case, an X axis gradient magnetic field, a Y axis gradient magnetic field, and a Z axis gradient magnetic field formed by the gradient magnetic field coils 3x, 3y, and 3z are mainly used as a gradient magnetic field for phase encoding (PE), a gradient magnetic field for readout (RO), and a gradient magnetic field for slice encoding (SE), respectively. Consequently, an X coordinate, a Y coordinate, and a Z coordinate, which are positional information of atomic nuclei, are converted into a phase, a frequency, and a position of a slice of atomic nuclear spin, respectively, and the sequence is executed repeatedly while the phase encode amount is changed.

Then, an NMR signal, which is generated following the excitation of the atomic nuclear spin in the patient P, is received by the RF coil 4 and given to a receiver 11 to be converted into digitized raw data. Moreover, the raw data is fed to the sequence controller control unit 7 via the sequence controller 8. The sequence controller control unit 7 arranges the raw data in a K space (Fourier space) formed in a raw data database 12. Then, an image reconstructing unit 13 executes Fourier transformation for the raw data arranged in the K space, whereby a reconstructed image of the patient P is obtained.

As one of fast imaging techniques using such an MRI apparatus 1, there is a parallel imaging (PI) method (e.g., see the thesis "Carlson J. W. and Minemura T., Image Time Reduction Through Multiple Receiver Coil Data Acquisition and Image Reconstruction, MRM 29: 681–688, 1993", the thesis "Sodikson D. K. and Manning W. J., Simultaneous Acquisition of Spatial Harmonics (SMASH): Fast Imaging with Radiofrequency Coil Arrays, MRM 38:591–603, 1997", the thesis "Pruessman K. P., Weiger M., Scheidegger M. B., and Boesiger P., SENSE: Sensitivity Encoding for Fast MRI, MRM 42:952–962, 1999", and the thesis "Ra J. B. and Rim C. Y., Fast Imaging Using Subencoding Data Sets From Multiple Detectors, MRM 30:142–145, 1993"). The PI method is a imaging method in which a multi-coil constituted by plural surface coils is used as the RF coil 4 and an NMR signal is received in the respective surface coils simultaneously to reconstruct an image. According to the PI method, since it is possible to reduce the number of phase encodes necessary for reconstruction of an image by the number of surface coils, imaging time can be reduced.

According to the PI method, imaging time with high resolution of a few seconds is possible even in three-dimensional (3D) imaging. Thus, the PI method is applied to dynamic imaging such as a magnetic resonance angiography (MRA) method for injecting a contrast agent into the patient P and observing temporal movement of the contrast agent. In dynamic imaging according to the PI method, since imaging in an extremely large number of temporal phases is possible, it is possible to image movement of the contrast agent in detail in a contrast MRA method.

Imaging according to the PI method is carried out in a procedure shown in Fig. 13. First, in step S1, as described above, imaging according to the PI sequence is performed and raw data is arranged in the K space formed in the raw data database 12. In the case of 3D dynamic imaging, 3D volume data as shown in FIG. 14(a) is obtained for respective temporal phases T.

Moreover, in step S2 in FIG. 13, the image reconstructing unit 13 reconstructs images for matrixes designated in advance in the K space. As shown in FIG. 14 (b), raw data included in the matrixes are subjected to 3D Fourier transformation (3D-FT), whereby 3D image information is obtained.

Here, aliasing called folding occurs in images obtained according to the PI method. Thus, in step S3 in FIG. 13, a PI unfolding processing unit 14 executes unfolding processing as post processing of the reconstructed image on the basis of a difference in sensitivity of the respective surface coils of the multi-coil.

As shown in FIG. 15, sensitivity map data D1 of the multi-coil is collected in advance and stored in a sensitivity map database 14a shown in FIG. 12. Then, as shown in FIG. 15, the P1 unfolding processing unit 14 slices sensitivity map data D1, into alias which respectively correspond to respective slice surfaces of 3D image information (actual space data) D3. PI unfolding processing is obtained by subjecting raw data D2 in K space to 3D-FT, and using sensitivity map database 14a as sensitivity map data D4 for unfolding processing. Moreover, concerning the 3D image information D3, the PI unfolding processing unit 14 executes PI unfolding processing for respective slices using sensitivity map data D4 for unfolding processing to obtain 3D images after PI unfolding processing as unfolded images D5.

As a result, as shown in FIG. 14 (c), all images in all temporal phases are obtained and stored according to circumstances.

In step S4 in FIG. 13, with an image in a predetermined temporal phase as a parent image, a difference processing unit 15 executes difference (complex difference, absolute value difference) processing for images in temporal phases later than that of the parent image as required. Consequently, as shown in FIG. 14 (d), difference images in temporal phases later than that of the parent image are obtained and stored according to circumstances.

Moreover, in step S5 in FIG. 13, an MIP processing unit 16 executes MIP processing, which is image processing according to a maximum intensity projection (MIP) method, as required to project all the 3D images and the difference images on a 2D plane and obtain MIP images. In other words, slice image data having a maximum signal value among respective slice image data forming the 3D images is set as a value on the projected surface, whereby all the 2D images shown in FIG. 14 (e) or the MIP images, which are difference images, shown in FIG. 14 (f) are obtained.

As a result, in step S6 in FIG. 13, the MIP images and all the images and the difference images in all the temporal phases are stored in an image database 17 as images for confirmation. Moreover, an image display unit 18 gives the images for confirmation stored in the image database 17 to a display device 19 and displays the images for confirmation. Consequently, an operator can judge propriety of imaging by confirming the images for confirmation such as the MIP images and all the images in all the temporal phases.

On the other hand, in 3D imaging by the MRI apparatus 1, in view of the fact that 3D reconstruction processing for 3D volume data is enormous, a technique for creating a Reference View is used (see, for example, U.S. Pat. No. 5,166,875 and JP-B-5-78341). The Reference View is a 2D image that is obtained by slicing two-dimensional (2D) data in the center of the K space from 3D volume data and subjecting the 2D data to the 2D-FT and is briefly equivalent to a projected image. With this Reference View, the operator can confirm an image with a smaller amount of data processing and in a short time.

In addition, there is proposed a technique for, in the 3D imaging by the MRI apparatus 1, subjecting 2D data obtained from time to time during imaging to the 2D-FT for speedup of image display to thereby reconstruct and display a 2D image (see, for example, JP-A-2-46828).

In fast contrast MRA imaging according to the PI method, observation on a real time basis with improved imaging time resolution is desired. However, in the conventional MRI apparatus 1, since time of about several tens seconds to several minutes is required for processing such as image reconstruction including reconstruction processing like zero padding and the PI unfolding processing, observation on a real time basis is difficult. Therefore, long time is required until an image for confirmation, which is a final image, is displayed, and the operator cannot confirm propriety of imaging immediately after the imaging. As a result, there is a problem in that it is impossible to let the patient P off the MRI apparatus 1 until an image for confirmation is obtained and the operator confirms propriety of imaging.

Moreover, in the case of dynamic imaging, since imaging an extremely large number of temporal phases is usually performed, there is a problem in that the volume of images to be stored becomes enormous and it takes time to retrieve and transfer images.

On the other hand, the conventional technique using the Reference View is not applicable to PI because even if the Reference View is used directly, such images would have aliasing in a phase encode direction. Thus, only an image of accuracy insufficient for confirming propriety of imaging can be quickly obtained conventionally with PI. In other words, in PI imaging, since a field of view (FOV) in the phase encode direction is set small, when quick reference images are reconstructed in that state, the images will have aliasing in the phase encode direction (according to the FOV size).

SUMMARY

According to one aspect of the invention, PI MRI in fast contrast MRA can display confirmation images in a shorter time.

According to another aspect of the invention, magnetic resonance imaging apparatus and a processing method for PI MRI data collection is capable of reducing the volume of data that should be stored for the dynamic PI MRI.

A magnetic resonance imaging apparatus in accordance with the invention includes: a sensitivity map database that stores sensitivity map data of a multi-coil consisting of plural coils necessary for parallel imaging unfolding processing; a data slicing unit that slices partial data from three-dimensional volume data collected for the respective coils by parallel imaging photographing, respectively; an intermediate image reconstructing unit that executes reconstruction processing for the partial data to thereby reconstruct intermediate images for the respective coils; and a reference image generating unit that slices sensitivity map data corresponding to the intermediate images from the sensitivity map database as sensitivity map data for unfolding processing, executes the parallel imaging unfolding processing for the intermediate images using the sensitivity map data for unfolding processing, and generates reference images.

In addition, a processing method for magnetic resonance imaging collection data in accordance with the invention includes: a step of slicing partial data from three-dimensional volume data collected for respective coils of a multi-coil consisting of plural coils by parallel imaging, respectively; a step of executing reconstruction processing for the partial data to thereby reconstruct intermediate images for the respective coils; a step of slicing sensitivity map data corresponding to the intermediate images from sensitivity map data of the multi-coil necessary for parallel imaging unfolding processing as sensitivity map data for unfolding processing; and a step of executing the parallel imaging unfolding processing for the intermediate images using the sensitivity map data for unfolding processing to thereby generate reference images.

In the magnetic resonance imaging apparatus and the processing method for magnetic resonance imaging collection data as described above, it is possible to display images for confirmation for confirming propriety of imaging in a shorter time in the fast contrast MRA imaging according to the PI method.

BRIEF DESCRIPTION OF THE DRAWINGS

In the accompanying drawings.

DETAILED DESCRIPTION

A magnetic resonance imaging apparatus and a processing method for magnetic resonance imaging collection data will be explained with reference to the accompanying drawings.

Figure 1:
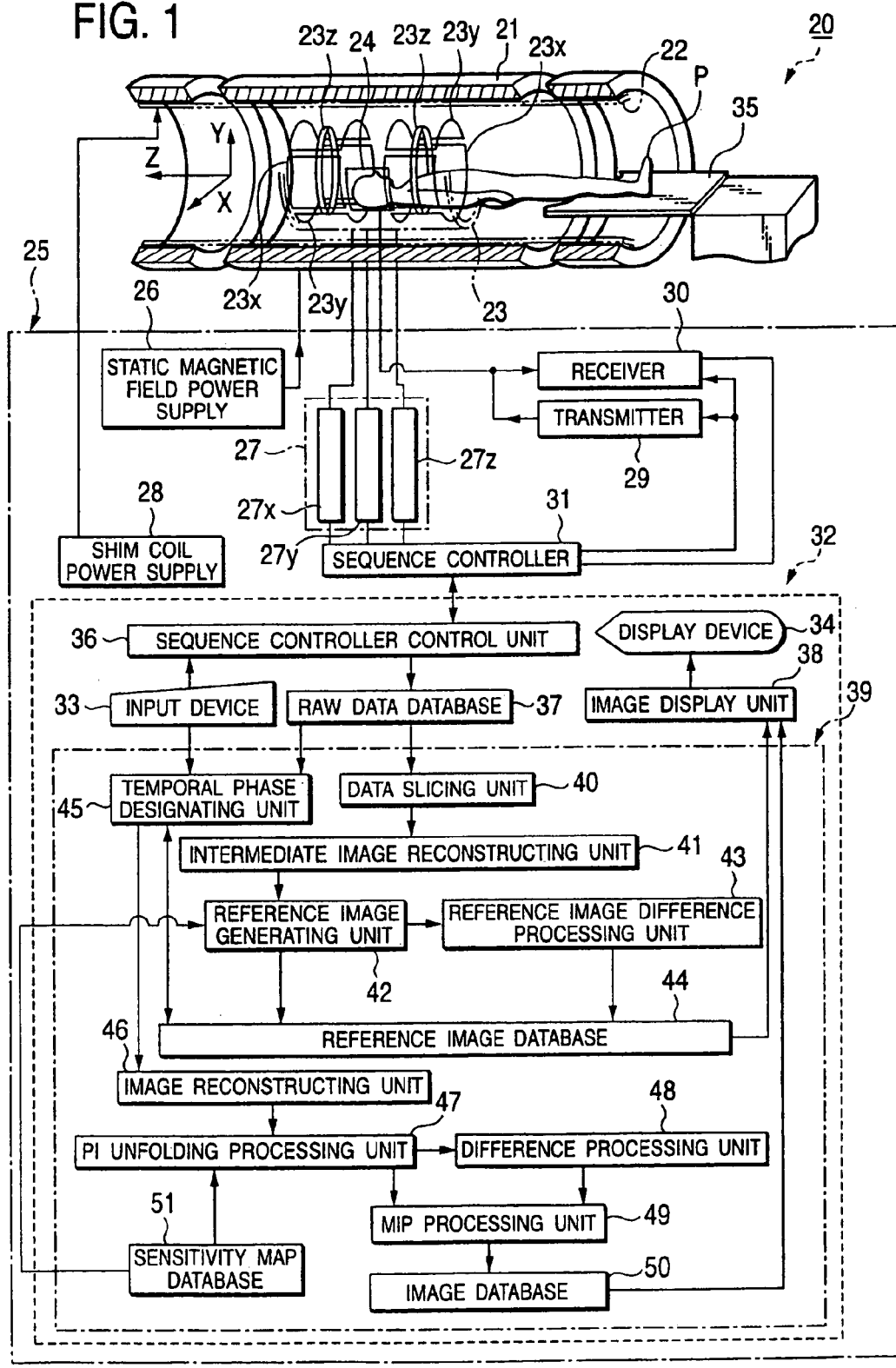
FIG. 1 is a functional block diagram showing a first embodiment of a magnetic resonance imaging apparatus.

FIG. 1 is a functional block diagram showing a first embodiment of a magnetic resonance imaging apparatus.

An MRI apparatus 20 has a structure in which a cylindrical magnet for static magnetic field 21 that forms a static magnetic field, a shim coil 22 provided in the inside of this magnet for static magnetic field 21, a gradient magnetic field coil unit 23, and an RF coil 24 are positioned in a gantry.

The MRI apparatus 20 also includes a control system 25. The control system 25 includes a static magnetic field power supply 26, a gradient magnetic field power supply 27, a shim coil power supply 28, a transmitter 29, a receiver 30, a sequence controller 31, and a computer 32. The gradient magnetic field power supply 27 of the control system 25 includes an X axis gradient magnetic field power supply 27x, a Y axis gradient magnetic field power supply 27y, and a Z axis gradient magnetic field power supply 27z. The computer 32 includes an processing unit and a storage and is provided with an input device 33 and a display device 34.

The magnet for static magnetic field 21 is connected to the static magnetic field power supply 26 and has a function of forming a static magnetic field in an imaging area with an electric current supplied from the static magnetic field power supply 26. The cylindrical shim coil 22 is provided in the inside of the magnet for static magnetic field 21 coaxially with the magnet for static magnetic field 21. The shim coil 22 is connected to the shim coil power supply 28 and constituted such that a static magnetic field is uniformalized when an electric current is supplied to the shim coil 22 from the shim coil power supply 28.

The gradient magnetic field coil unit 23 includes an X axis gradient magnetic field coil 23x, a Y axis gradient magnetic field coil 23y, and a Z axis gradient magnetic field coil 23z and is formed in a cylindrical shape in the inside of the magnet for static magnetic field 21. A bed 35 is provided as an imaging area in the inside of the gradient magnetic field coil unit 23. A patient P is set on the bed 35. The RF coil 24 is provided near the bed 35 or the patient P.

The gradient magnetic field coil unit 23 is connected to the gradient magnetic field power supply 27. The X axis gradient magnetic field coil 23x, the Y axis gradient magnetic field coil 23y, and the Z axis gradient magnetic field coil 23z of the gradient magnetic field coil unit 23 are connected to the X axis gradient magnetic field power supply 27x, the Y axis gradient magnetic field power supply 27y, and the Z axis gradient magnetic field power supply 27z of the gradient magnetic field power supply 27, respectively.

It is possible to form a gradient magnetic field Gx in an X axis direction, a gradient magnetic field Gy in a Y axis direction, and a gradient magnetic field Gz in a Z axis direction in the imaging area, respectively, with electric currents supplied from the X axis gradient magnetic field power supply 27x, the Y axis gradient magnetic field power supply 27y, and the Z axis gradient magnetic field power supply 27z to the X axis gradient magnetic field coil 23x, the Y axis gradient magnetic field coil 23y, and the Z axis gradient magnetic field coil 23z, respectively.

The RF coil 24 is a multi-coil and connected to the transmitter 29 and the receiver 30. The RF coil 24 has a function of receiving an RF signal from the transmitter 29 and transmitting the RF signal to the patient P and a function of receiving an NMR signal, which is generated following excitation by an RF signal of an atomic nuclear spin inside the patient P, and giving the NMR signal to the receiver 30.

Figure 2:
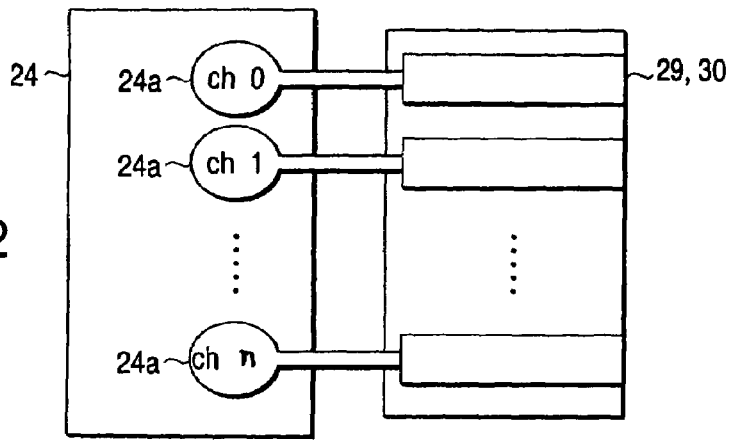
FIG. 2 is a diagram of a multi-coil that is used as an RF coil shown in FIG. 1.

FIG. 2 is a diagram of a multi-coil used as the RF coil 24 shown in FIG. 1.

The RF coil 24 is a multi-coil including plural surface coils 24a. The respective surface coils 24a of the RF coil 24 are connected to the transmitter 29 and the receiver 30 individually. Therefore, with the respective surface coils 24a of the RF coil 24, it is possible to transit the RF signal to the patient P in multi channels and receive the NMR signal and gives the NMR signal to the receiver 30.

The sequence controller 31 of the control system 25 is connected to the gradient magnetic field power supply 27, the transmitter 29, and the receiver 30. The sequence controller 31 has a function of storing sequence information describing control information necessary for driving the gradient magnetic field power supply 27, the transmitter 29, and the receiver 30, for example, operation control information such as intensity, application time, and application timing of a pulse current to be applied to the gradient magnetic field power supply 27 and a function of driving the gradient magnetic field power supply 27, the transmitter 29, and the receiver 30 in accordance with a stored predetermined sequence to thereby generate the X axis gradient magnetic field Gx, the Y axis gradient magnetic field Gy, the Z axis gradient magnetic field Gz, and the RF signal.

In addition, the sequence controller 31 receives raw data, which is a digitized NMR signal, from the receiver 30 and give the raw data to the computer 32.

Therefore, the transmitter 29 is provided with a function of giving the RF signal to the RF coil 24 on the basis of the control information received from the sequence controller 31. On the other hand, the receiver 30 is provided with a function of executing predetermined signal processing for the NMR signal received from the RF coil 24 and subjecting the NMR signal to A/D conversion to thereby generate raw data, which is a digitized NMR signal, and a function of giving the generated raw data to the sequence controller 31.

The computer 32 reads and executes a program to thereby function as a sequence controller control unit 36, a raw data database 37, an image display unit 38, and a PI collection signal processing system 39. The PI collection signal processing system 39 includes a data slicing unit 40, an intermediate image reconstructing unit 41, a reference image generating unit 42, a reference image difference processing unit 43, a reference image database 44, a temporal phase designating unit 45, an image reconstructing unit 46, a PI unfolding processing unit 47, a difference processing unit 48, an MIP processing unit 49, an image database 50, and a sensitivity map database 51. However, the computer 32 maybe provided with a specific circuit regardless of a program.

The sequence controller control unit 36 has a function of giving a PI sequence, which is a sequence for executing PI photographing, to the sequence controller 31 on the basis of information from the input device 33 or other components to cause the sequence controller 31 to perform drive control according to the PI method. In addition, the sequence controller control unit 36 has a function of receiving raw data of respective temporal phases, which are collected for respective coils of the multi-coil in dynamic photographing according to the PI sequence or photographing in a single temporal phase, from the sequence controller 31 and arranges the raw data in a K space (Fourier space) formed in the raw data database 37 as 3D volume data.

Therefore, the raw data according to the PI method generated in the receiver 30 are stored in the raw data database 37 for the respective temporal phases. In other words, the raw data is arranged in the K space formed in the raw data database 37.

Sensitivity map data of a multi-coil including plural coils necessary for PI unfolding processing are saved in the sensitivity map database 51.

The data slicing unit 40 has a function of slicing 2D data in an arbitrary slice as an example of partial data from the raw data arranged as 3D volume data in the K space of the raw data database 37 and a function of giving the sliced 2D data to the intermediate image reconstructing unit 41. In this case, the data slicing unit 40 is adapted such that it is possible to slice 2D data, which is capable of controlling influence of raw data obtained by an NMR signal from stationary part tissues other than blood vessels, as required. In other words, the data slicing unit 40 is provided with a function of slicing 2D data not including the center of the K space, for example, 2D data of a part slightly deviating from the center of the K space as required.

The intermediate image reconstructing unit 41 has a function of executing 2D-FT, which is reconstruction processing, for the 2D data, which is partial data, received from the data slicing unit 40 to thereby reconstruct 2D intermediate images of the patient P for the respective coils as an example of intermediate images and a function of giving the obtained respective 2D intermediate images to the reference image generating unit 42.

The reference image generating unit 42 has a function of executing the PI unfolding processing for the 2D intermediate images received from the intermediate image reconstructing unit 41 to thereby generate 2D reference images as reference images and a function of giving 2D reference images, which are respective 2D intermediate images after the PI unfolding processing, to the reference image difference processing unit 43 and writing the 2D reference images in the reference image database 44.

Here, since the 2D intermediate images are obtained by the 2D-FT, a slice thickness is a slab selection excitation thickness. Thus, the reference image generating unit 42 slices sensitivity map data corresponding to intermediate images from the sensitivity map data of the multi-coil stored in the sensitivity map database 51 as sensitivity map data for unfolding processing and uses the sensitivity map data for the PI unfolding processing. As the sensitivity map data corresponding to the 2D intermediate images, for example, sensitivity map data in an arbitrary position such as sensitivity map data equivalent to a center position of a 2D-FT slab can be used.

The reference image subtraction processing unit 43 has a function of, with a 2D reference image in a predetermined temporal phase, for example, a temporal phase before imaging by a contrast agent among 2D reference images, which are the 2D intermediate images after the PI unfolding processing received from the reference image generating unit 42, as a 2D parent reference image, executing subtraction (DSA: Digital Subtraction Anigiology) processing such as complex subtraction processing and absolute value difference processing for 2D reference images in temporal phases later than that of the 2D parent image, for example, in temporal phases after imaging by the contrast agent to thereby obtain 2D subtraction reference images and a function of writing the obtained 2D subtraction reference images in the reference image database 44.

The 2D reference images generated by the reference image generating unit 42 and the 2D subtraction reference images generated by the reference image subtraction processing unit 43 are accumulated in the reference image database 44.

The temporal phase designating unit 45 has a function of receiving designation information for 2D reference images or 2D subtraction reference images from the input device 33, extracting raw data in designated temporal phases, which are temporal phases of the designated 2D reference images or 2D subtraction reference images, from the raw data database 37, and giving the raw data to the image reconstructing unit 46. In this case, the temporal phase designating unit 45 is constituted such that it is possible to refer to the 2D reference images or the 2D difference reference images stored in the reference image database 44. The designated phases may be a single temporal phase or plural temporal phases.

However, the temporal phase designating unit 45 may be provided with a function of receiving temporal phase designation information from the input device 33 rather than the designation information for the 2D reference images or the 2D subtraction reference images and, with temporal phases corresponding to the temporal phase designation information as designated temporal phases, extracting raw data in respective designated temporal phases from the raw data database 37.

The image reconstructing unit 46 has a function of executing the 3D-FT for the raw data in respective designated temporal phases received from the phase designating unit 45 to thereby reconstruct 3D images of the patient P and a function of giving the obtained respective 3D images to the PI unfolding processing unit 47.

The PI unfolding processing unit 47 has a function of executing the PI unfolding processing for the 3D images in the respective designated temporal phases received from the image reconstructing unit 46 and a function of giving the respective 3D images after the PI unfolding processing to the difference processing unit 48 and the MIP processing unit 49 and writing the 3D images in the image database 50. In this case, the PI unfolding processing unit 47 is adapted to slice sensitivity map data corresponding to the 3D images from the sensitivity map data stored in the sensitivity map data base 51 as sensitivity map data for unfolding processing and use the sensitivity map data for the PI unfolding processing. As the sensitivity map data for unfolding processing corresponding to the 3D images, sensitivity map data corresponding to respective 3D-FT slice surfaces of the 3D images can be used.

The difference processing unit 48 has a function of, with a 3D image in a predetermined temporal phase, for example, a temporal phase of the 2D parent reference image (a temporal phase before imaging by a contrast agent) among respective 3D images after the PI unfolding processing received from the PI unfolding processing unit 47, as a 3D parent reference image, executing the subtraction processing such as the complex subtraction processing and the absolute value difference processing for 3D images in temporal phases later than that of the 3D parent image to thereby obtain 3D subtraction images and a function of giving the obtained 3D subtraction images to the MIP processing unit 49 and writing the 3D subtraction images in the image database 50.

The MIP processing unit 49 has a function of applying MIP processing, which sets slice image data having a maximum signal value among respective image data including 3D images or 3D reference images as a value on a projection surface, to the respective 3D images after the PI unfolding processing received from the PI unfolding processing unit 47 and the 3D subtraction images received from the subtraction processing unit 48 to thereby obtain MIP images obtained by projecting the 3D images or the 3D subtraction images on a 2D plane and a function of writing the obtained MIP images in the image database 50.

The respective 3D images after the PI unfolding processing in the respective designated temporal phase generated by the image reconstructing unit 46, the 3D difference images in the respective designated temporal phases generated by the subtraction processing unit 48, and the MIP images in the respective designated temporal phases generated by the MIP processing unit 49 are stored in the image database 50.

The image display unit 38 has a function of giving the 2D reference images and the 2D subtraction reference images stored in the reference image database 44 and the 3D images, the 3D subtraction images, and the MIP images stored in the image database 50 to the display device 34 and causing the display device 34 to display the images.

Note that it is possible to give the 2D reference images and the 2D subtraction reference images stored in the reference image database 44 to the display device 34 on a real time basis at a point when data collection in an arbitrary temporal phase is completed and cause the display device 34 to display the images even during imaging. In this case, the data slicing unit 40, the intermediate image reconstituting unit 41, the reference image generating unit 42, and the reference image subtraction processing unit 43 execute the respective kinds of processing described above on a real time basis, respectively, at a point when data collection in an arbitrary temporal phase is completed such that it is possible to generate the 2D reference images and the 2D subtraction reference images one by one.

Next, an operation of the MRI apparatus 20 will be explained.

Figure 3:
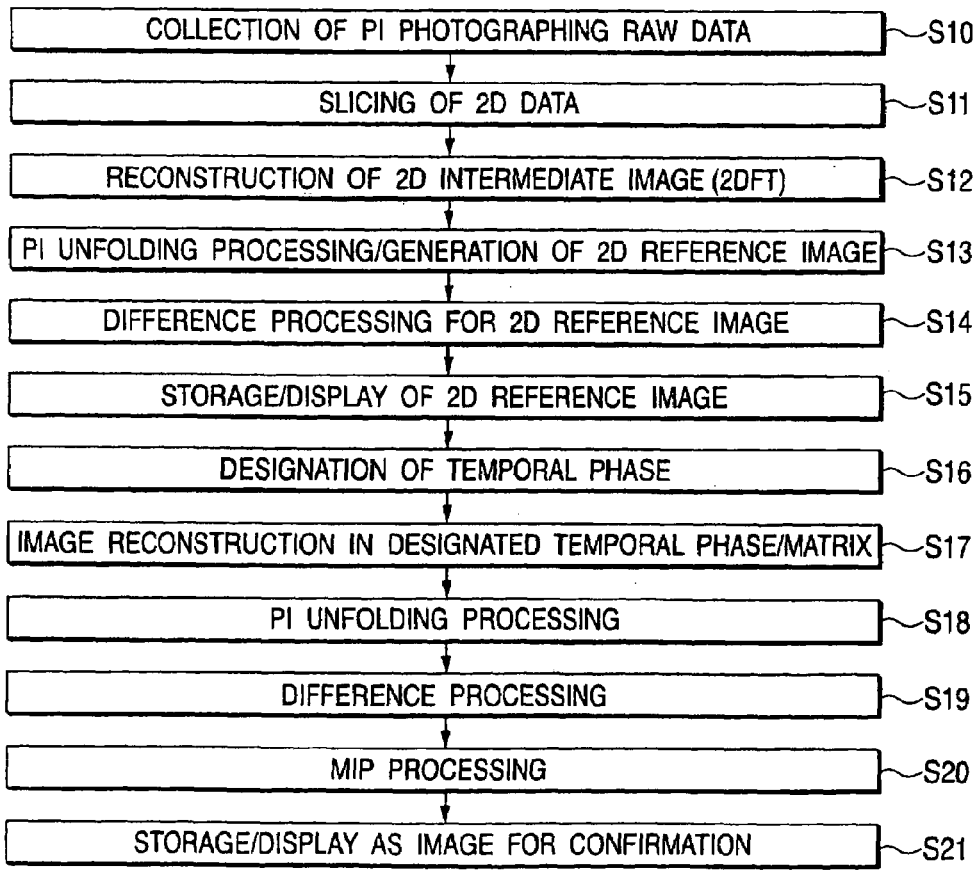
FIG. 3 is a flowchart showing a procedure at the time when a tomographic image of a patient P according to a PI method is picked up by the MRI apparatus shown in FIG. 1.
Figure 4:
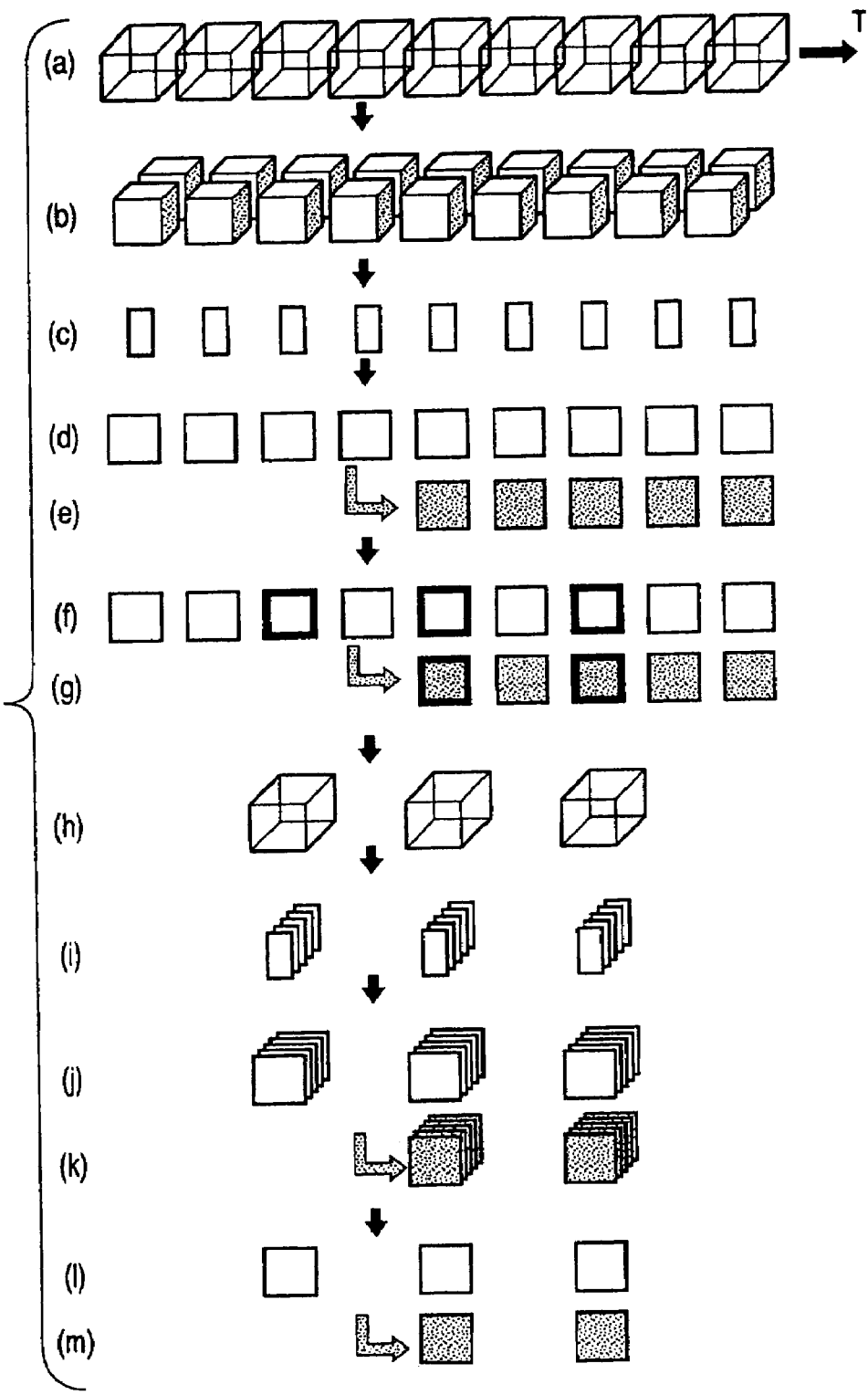
FIG. 4 is a diagram showing data obtained by the respective kinds of processing of the PI method shown in FIG. 3.

FIG. 3 is a flowchart showing a procedure when tomographic images of the patient P are picked up by the MRI apparatus 20 shown in FIG. 1. In the figure, numerals attached with a character S indicate respective steps of the flowchart. FIG. 4 is a diagram showing data obtained by respective kinds of processing of the PI method shown in FIG. 3.

First, in step S10, the dynamic imaging according to the contrast MRA method is performed in accordance with a PI sequence, and raw data in respective temporal phases are sequentially arranged as 3D volume data in the K space formed in the raw data database 12. In this case, the 3D volume data are sorted in time series.

The patient P is set on the bed 35, and an electric current is supplied from the static magnetic field power supply 26 to the magnet for static magnetic field 21, whereby a static magnetic field is formed in an imaging area. In addition, an electric current is supplied from the shim coil power supply 28 to the shim coil 22, whereby the static magnetic field formed in the imaging area is uniformalized.

Next, an operation instruction is given from the input device 33 to the sequence controller control unit 36 together with selection information for a PI sequence. Therefore, the sequence controller control unit 36 gives the PI sequence to the sequence controller 31. The sequence controller 31 drives the gradient magnetic field power supply 27, the transmitter 29, and the receiver 30 in accordance with the PI sequence received from the sequence controller control unit 36 to thereby form an X axis gradient magnetic field Gx, a Y axis gradient magnetic field Gy, and a Z axis gradient magnetic field Gz in the imaging area where the patient P is set and generate an RF signal.

In this case, the X axis gradient magnetic field Gx, the Y axis gradient magnetic field Gy, and the Z axis gradient magnetic field Gz formed by the gradient magnetic field coil are mainly used as a gradient magnetic field for PE, a gradient magnetic field for RO, and a gradient magnetic field for SE, respectively. Consequently, regularity appears in a rotating direction of an atomic nuclear spin in the inside of the patient P. An X coordinate and a Y coordinate, which are two-dimensional positional information in a slice formed in a Z axis direction by the gradient magnetic field for SE, are converted into a phase change amount and a frequency change amount of the atomic nuclear spin in the inside of the patient P by the gradient magnetic field for PE and the gradient magnetic field for RO, respectively.

Then, an RF signal is given from the transmitter 29 to the respective surface coils 24*a* through the respective channels of the RF coil 24 according to the PI sequence, and the RF signal is transmitted from the respective surface coils 24*a* to the patient P. Moreover, an NMR signal, which is generated by nuclear magnetic resonance of an atomic nuclear included in a slice corresponding to a frequency of the RF signal in the inside of the patient P, is received by the respective surface coils 24*a* of the RF coil 24 and given to the receiver 30.

The receiver 30 receives the NMR signal from the respective surface coils 24*a* of the RF coil 24 and executes respective kinds of signal processing such as preliminary amplification, middle frequency conversion, phase detection, low frequency amplification, and filtering. In addition, the receiver 30 subjects the NMR signal to A/D conversion to thereby generate raw data that is an NMR signal of digital data. The receiver 30 gives the generated raw data to the sequence controller 31.

The sequence controller 31 gives the raw data received from the receiver 30 to the sequence controller control unit 36 and the sequence controller control unit 36 arranges the raw data in the K space formed in the raw data database 37. As a result, raw data, which change in time series as shown in FIG. 4A, are collected three-dimensionally dynamically, and raw data of respective temporal phases in respective slices of the patient P are accumulated in the raw data database 37 as 3D volume data.

Note that, in PI dynamic imaging according to the contrast MRA method, prior to main scan for generating the MRA images described above, scan for sensitivity distribution measurement for measuring a sensitivity distribution of the surface coils 24a to obtain sensitivity map data is executed by the PI sequence. Then, a contrast agent for intensifying brightness of the MRA images after the execution of the scan for sensitivity distribution measurement is injected to the patient P. The main scan is executed by, for example, a predetermined number of times sufficient for measuring a brightness intensifying effect of the contrast medium.

For reduction of a scan time, the scan for sensitivity distribution measurement is performed with a matrix size with a space resolution lowered using a faster sequence. A desired 3D pulse sequence for contrast MRA is used for the main scan, and the 3D pulse sequence is set with the number of steps of phase encodes reduced (curtailed).

Consequently, in the PI method, it is possible to reduce the number of phase encodes for reconstruction of images. Since the time resolution is improved as the number of the surface coils 24a increases, it is possible to reduce an imaging time. For example, if the number of surface coils 24a is n, it is possible to improve the time resolution to n times as high and, on the other hand, the imaging times can be reduced to 1/n, for example.

Next, in step S11, the data slicing unit 40 slices 2D data in an arbitrary slice as shown in FIG. 4B from the raw data in the respective temporal phases arranged in the K space of the raw data database 37 as 3D volume data, respectively, and sequentially gives the sliced 2D data in the respective temporal phases to the intermediate image reconstructing unit 41. In other words, the data slicing unit 40 slices 2D data for generating an image for confirmation for judging propriety of imaging from the 3D volume data.

Here, the data slicing unit 40 slices 2D data, which is capable of reducing influence of raw data obtained by an NMR signal from stationary part tissues other than blood vessels, for example, 2D data not including the center of the K space not including a low frequency component near the center of the K space. For example, when a slab selection excitation thickness of the 3D volume data is assumed to be α cm, 2D data in a range from ±1 to ±α in a slice encode direction from the center of the K space are sliced by the data slicing unit 40.

When the 2D data for generating a confirmation image is slightly shifted from the center of the K space, a signal from a stationary part is reduced, and it is possible to intensify a signal from a fine structure such as a blood vessel. Consequently, it is possible to slice the 2D data, in which the raw data from the stationary part tissues other than blood vessels are reduced, for images for confirmation. However, since the 2D data to be sliced is far from the center of the K space excessively, a signal from a thick blood vessel could be also reduced, therefore appropriate α is set. It is possible to set a value of α empirically in advance on the basis of, for example, data in the past such that a required signal reduced amount is obtained.

Next, in step S12, the intermediate image reconstructing unit 41 sequentially executes the 2D-FT for the 2D data in the respective temporal phases received from the data slicing unit 40 to thereby reconstruct 2D intermediate images of the patient P as shown in FIG. 4C and gives the obtained respective 2D intermediate images to the reference image generating unit 42.

Next, in step S13, the reference image generating unit 42 sequentially executes the PI unfolding processing for the 2D intermediate images in the respective temporal phases received from the intermediate image reconstructing unit 41 on the basis of a sensitivity distribution of the surface coils 24a measured by the scan for sensitivity distribution measurement in advance to thereby generate 2D reference images as shown in FIG. 4D.

Figure 5:
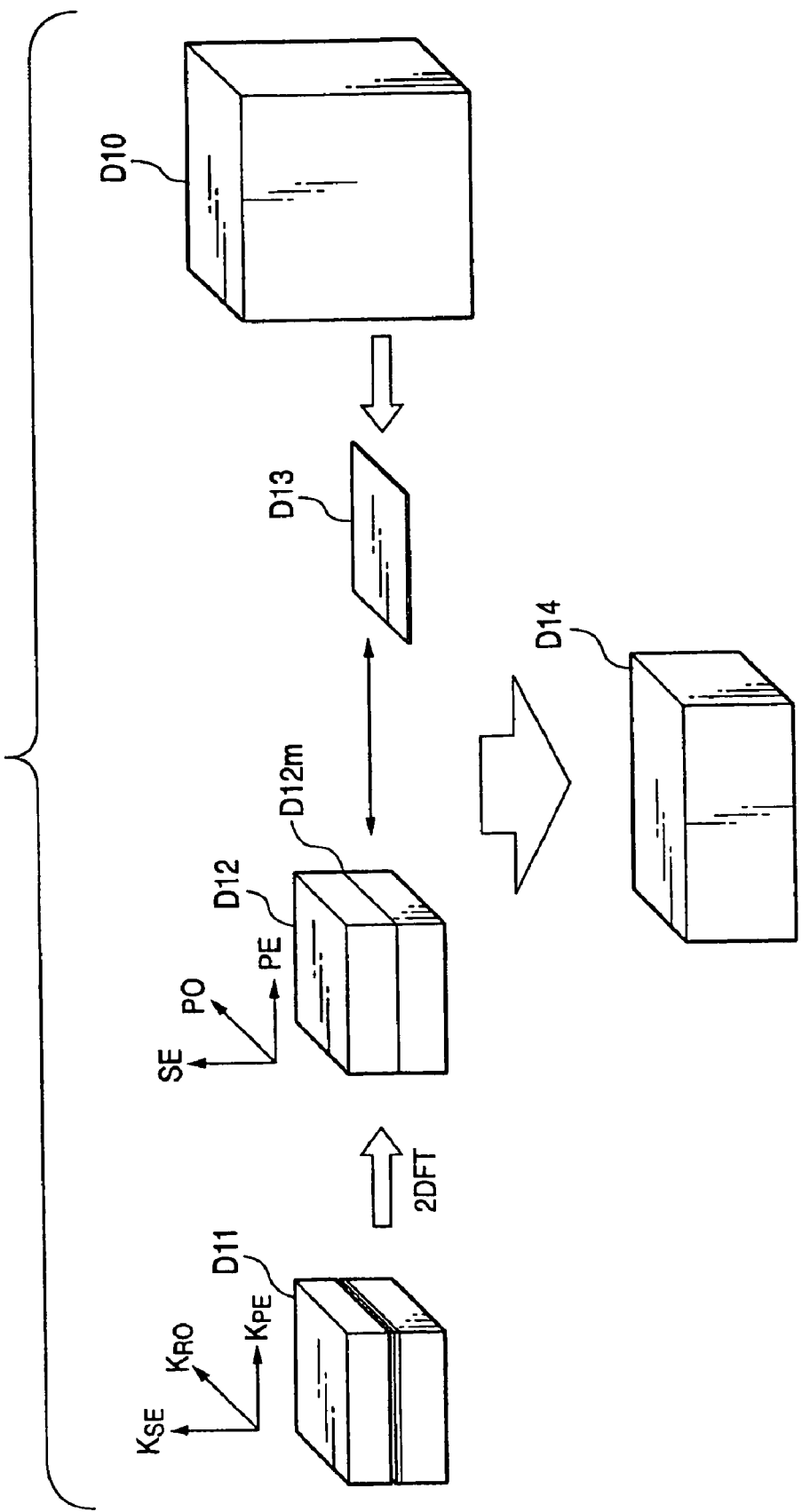
FIG. 5 is a conceptual diagram showing a procedure of PI unfolding processing for a 2D intermediate image shown in FIG. 3.

FIG. 5 is a conceptual diagram showing a procedure of the PI unfolding processing for the 2D intermediate images shown in FIG. 3.

As shown in FIG. 5, sensitivity map data D10 of a multi-coil for the PI unfolding processing are collected by the scan for sensitivity distribution measurement and stored in the sensitivity map database 51. Then, 2D data are sliced from 3D volume data D11 by the data slicing unit 40 and subjected to the 2D-FT by the intermediate image reconstructing unit 41, and 2D intermediate images D12 are obtained as actual space data before the PI unfolding processing.

Moreover, the reference image generating unit 42 slices, for example, the sensitivity map data D10 corresponding to a central position D12m of a 2D-FT slab in the 2D intermediate images D12 from the sensitivity map data D10 stored in the sensitivity map database 51 as sensitivity map data for unfolding processing D13. Then, the reference image generating unit 42 executes the PI unfolding processing for the 2D intermediate images D12 using the map data for unfolding processing D13, whereby 2D reference images D14 is obtained.

The reference image generating unit 42 sequentially stores the obtained respective 2D reference images in the reference image database 44. In addition, when subtraction images are necessary for reference, the reference image generating unit 42 sequentially gives the respective 2D reference images to the reference image subtraction processing unit 43.

Next, in step S14, when the reference image subtraction processing unit 43 receives the 2D reference images from the reference image generating unit 42, with a 2D reference image in a predetermined temporal phase, for example, a temporal phase before injection of a contrast agent as a 2D parent reference image, the reference image subtraction processing unit 43 executes the subtraction processing such as the complex subtraction processing and the absolute value subtraction processing for the 2D reference images in temporal phases after the injection of the contrast agent with temporal phases later than that of the 2D parent reference image to thereby generate 2D subtraction reference images as shown in FIG. 4E. Moreover, the reference image difference processing unit 43 writes the generated 2D subtraction reference images in the reference image database 44.

As a result, in step S15, the 2D reference images and the 2D subtraction reference images are sequentially stored in the reference image database 44. Then, the image display unit 38 sequentially gives the 2D reference images and the 2D subtraction reference images in time series stored in the reference image database 44 to the display device 34 and causes the display device 34 to display the images on a real time basis.

Figure 6:
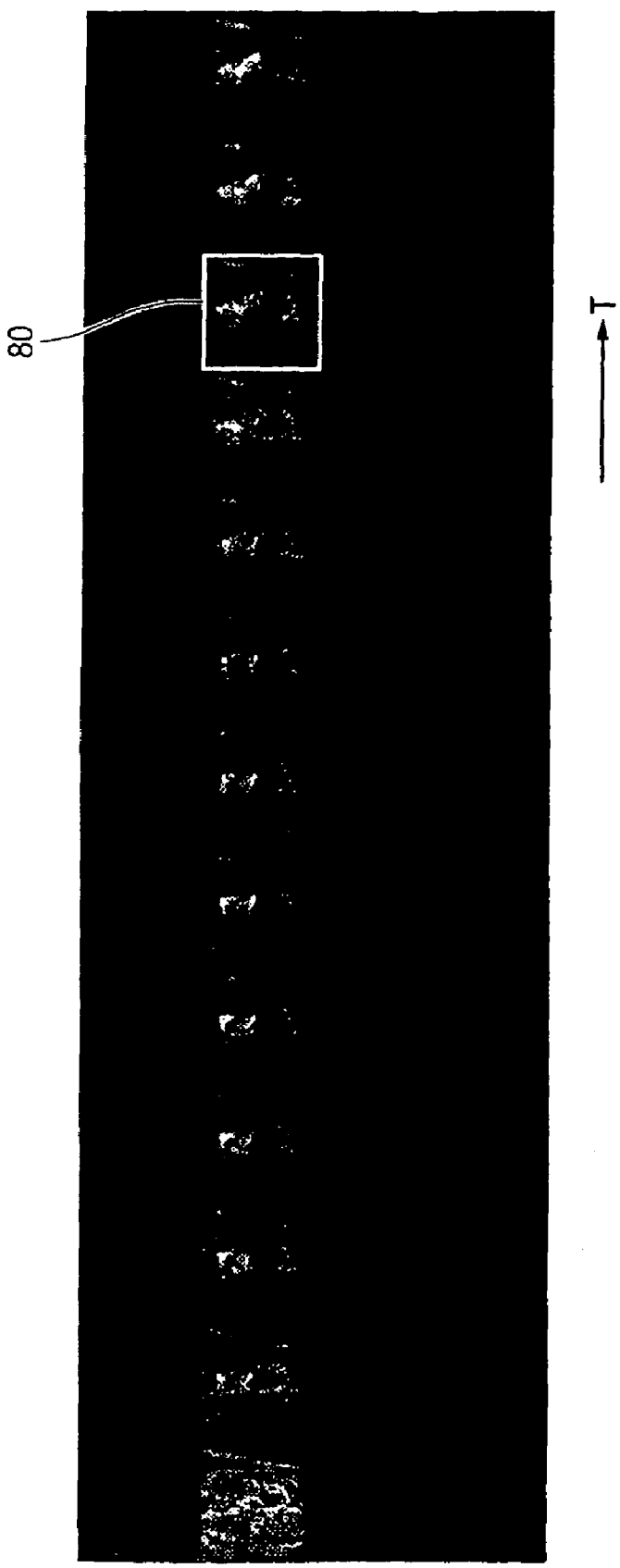
FIG. 6 is a diagram showing an example of reference images created by the MRI apparatus shown in FIG. 1.

FIG. 6 is a diagram showing an example of reference images created by the MRI apparatus shown in FIG. 1.

As shown in FIG. 6, 2D reference images in respective temporal phases T are sequentially displayed in time series on the display device 34. Consequently, the operator can judge propriety of the dynamic imaging according to the contrast MRA method by confirming the 2D reference images.

Here, a data processing amount for generating the 2D reference images and the 2D difference reference images is smaller than a data processing amount in the case in which 3D images are generated by subjecting 3D volume data in the K space to the 3D-FT and further subjecting the 3D images to the PI unfolding processing and the MIP processing to display 3D images and MIP images as in the past. Consequently, it is possible to display the 2D reference images and the 2D difference reference images in a short time compared with the case in which the 3D images and the MIP images are displayed. Thus, the operator can judge propriety of imaging on a real time basis faster.

Moreover, the operator can observe movement of a contrast agent on a real time basis and confirm whether the contrast medium has reached a diagnosis area in which temporal phase T after starting the dynamic imaging.

In addition, in the case of usual dynamic imaging, imaging is performed in an extremely large number of temporal phases, and a data amount to be stored is enormous. However, since a data amount is small when the 2D reference images and the 2D subtraction reference images are used as images for confirmation compared with the time when the 3D images and the MIP images are used as images for confirmation, it is possible to reduce the data amount to be stored. This makes it possible to reduce a time for retrieval and transfer of images, which is increased according to an increase in the number of images, and the patient P can be diagnosed in a shorter time.

Moreover, with the 2D reference image in temporal phases before injection of a contrast agent as the 2D parent reference image, the 2D subtraction reference images in temporal phases after the injection of the contrast agent obtained by the subtraction processing are sequentially displayed on the display device 34. This makes it possible to perform more precise observation. In this case, if both the 2D reference images and the 2D subtraction reference images in the temporal phases up to the 2D parent reference image are sequentially displayed on the display device 34, it is possible to observe the patient P on a real time basis in the respective temporal phases before and after the 2d parent reference image.

In addition, the operator can designate a temporal phase in which it is necessary to reconstruct the 3D images from the 2D reference images and the 2D subtraction reference images in the respective temporal phases.

Thus, in step S16, the operator gives designation information for the 2D reference images or the 2D subtraction reference images to the temporal phase designating unit 45 from the input device 33. For example, the operator gives designation information for the 2D reference images to the temporal phase designating unit 45 from the input device 33. Then, a designation indication 80 in a frame as shown in FIG. 6 is displayed on the display device 34.

Consequently, the temporal phase designating unit 45 receives the designation information for the 2D reference images or the 2D subtraction reference images from the input device 33 and refers to the 2D reference images or the 2D subtraction reference images stored in the reference image database 44 to thereby specify temporal phases of the designated 2D reference images or 2D subtraction reference images indicated by bold line frames as shown in FIG. 4F or FIG. 4G. With the specified temporal phases as designated temporal phases, the temporal phase designating unit 45 extracts 3D volume data (raw data) in the designated temporal phases from the raw data database 37 as shown in FIG. 4H and gives the 3D volume data to the image reconstructing unit 46.

Next, in step S17, the image reconstructing unit 46 sequentially executes the 3D-FT for matrixes, which are designated as ranges to be reconstructed in advance, in the 3D volume data (raw data) in the respective designated temporal phases received from the temporal phase designating unit 45 to thereby reconstruct the 3D images of the patient P as shown in FIG. 4I. Moreover, the image reconstructing unit 46 gives the respective 3D images obtained by the reconstruction to the PI unfolding processing unit 47.

Next, in step S18, the PI unfolding processing unit 47 sequentially executes the PI unfolding processing for the 3D images in the respective designated temporal phases received from the image reconstructing unit 46 to thereby generate respective 3D images after the PI unfolding processing as shown in FIG. 4J. In other words, sensitivity map data corresponding to respective slice surfaces of the 3D images are sliced by the PI unfolding processing unit 47 from the sensitivity map data of the multi-coil stored in the sensitivity map database 51 as sensitivity map data for unfolding processing. Then, the PI unfolding processing unit 47 executes the PI unfolding processing for the respective 3D images for respective slices using the sliced sensitivity map data for unfolding processing to obtain 3D images after the PI unfolding processing.

Moreover, the PI unfolding processing unit 47 sequentially gives the respective 3D images after the PI unfolding processing to the subtraction processing unit 48 and the MIP processing unit 49 and writes the 3D images in the image database 50.

Next, in step S19, with a 3D image in the temporal phase of the 2D parent reference image among the respective 3D images after the PI unfolding processing received from the PI unfolding processing unit 47 as a 3D parent image, the subtraction processing unit 48 executes the subtraction processing for the 3D images with temporal phases later than that of the 3D parent image to thereby generate 3D subtraction images as shown in FIG. 4K. The subtraction processing unit 48 gives the obtained 3D subtraction images to the MIP processing unit 49 and writes the 3D subtraction images in the image database 50.

Next, in step S20, the MIP processing unit 49 applies the MIP processing to the respective 3D images after the PI unfolding processing received from the PI unfolding processing unit 47 and the 3D subtraction image received from the subtraction processing unit 48, respectively, to thereby generate MIP images obtained by projecting the 3D images on a 2D plane shown in FIG. 4L and MIP images obtained by projecting the 3D subtraction images on a 2D plane shown in FIG. 4M. Then, the MIP processing unit 49 writes the obtained MIP images in the image database 50.

As a result, in step S21, the respective 3D images after the PI unfolding processing in the respective designated phases generated by the image reconstructing unit 46, the 3D subtraction images in the respective designated temporal phases generated by the subtraction processing unit 48, and the MIP images in the respective designated temporal phases generated by the MIP processing unit 49 are accumulated in the image database 50. Then, the image display unit 38 gives the 3D images, the 3D subtraction images, and the MIP images stored in the image database 50 to the display device 34 and causes the display device 34 to display the images.

Consequently, the 3D images, the 3D subtraction images, or the MIP images are generated by the PI collection signal processing system 39 only for temporal phases in which the 3D images, the 3D subtraction images, or the MIP images are necessary and displayed on the display device 34. In other words, the 3D images, the 3D subtraction images, or the MIP images are generated only for temporal phases necessary for diagnosis, whereby it is possible to cause the display device 34 to display the images in a shorter time compared with the case in which the 3D images, the 3D subtraction images, or the MIP images are generated by subjecting all 3D volume data to the 3D-FT.

As a result, the operator can confirm the 3D images, the 3D subtraction images, or the MIP images and perform diagnosis for the patient P earlier.

According to the MRI apparatus 20 described above, the 2D data with a smaller data amount are sliced from the 3D volume data to generate the 2D reference images or the 2D subtraction reference images as the images for confirmation with the processing such as the 2D-FT and the PI unfolding processing as described above. Thus, it is possible to display the images for confirmation for confirming propriety of imaging in a short time and reduce a data amount of the images for confirmation that should be stored. Moreover, only the 3D volume data in the temporal phases necessary for diagnosis are subjected to the 3D-FT and the PI unfolding processing to generate the 3D images, the 3D subtraction images, or the MIP images. Thus, it is possible not only to perform diagnosis for the patient P in a shorter time but also to reduce a data amount of the 3D images and the like that should be stored.

As a result, binding hours for the patient P after the dynamic imaging by the MRI apparatus 20 are reduced, which leads to improvement of a throughput.

In addition, since the subtraction images such as the 2D subtraction reference images and the 3D subtraction images are generated, it is possible to grasp temporal movement of a contrast agent on a real time basis.

Moreover, the 2D data not including the center of the K space of the low frequency component slightly shifted from the center of the K space are set as 2D data for generating the 2D reference images or the 2D subtraction reference images from the 3D volume data. Thus, it is possible to generate the 2D reference images or the 2D subtraction reference images with the raw data from the stationary part tissues other than blood vessels being controlled.

Note that, when the 3D images were reconstructed by performing the PI method for twenty-two slices with the conventional MRI apparatus 1 and subjecting the 3D volume data to the 3D-FT and the PI unfolding processing, time required for the reconstruction was 18 seconds and the MIP processing after the reconstruction required 1 second. However, it was confirmed that, in the MRI apparatus 20, the 3D images for diagnosis could be reconstructed in one second.

In addition, when the dynamic imaging for total thirty temporal phases was performed in twenty-two slices with the conventional MRI apparatus 1, it was necessary to store six hundred and sixty 3D images for the total thirty temporal phases. However, it was confirmed that, in the MRI apparatus 20, ninety-six images in total consisting of thirty 2D reference images and sixty-six 3D images, which are reconstructed by selecting three temporal phases and subjecting 3D volume data in the temporal phases to the 3D-FT, only had to be stored.

Figure 7:
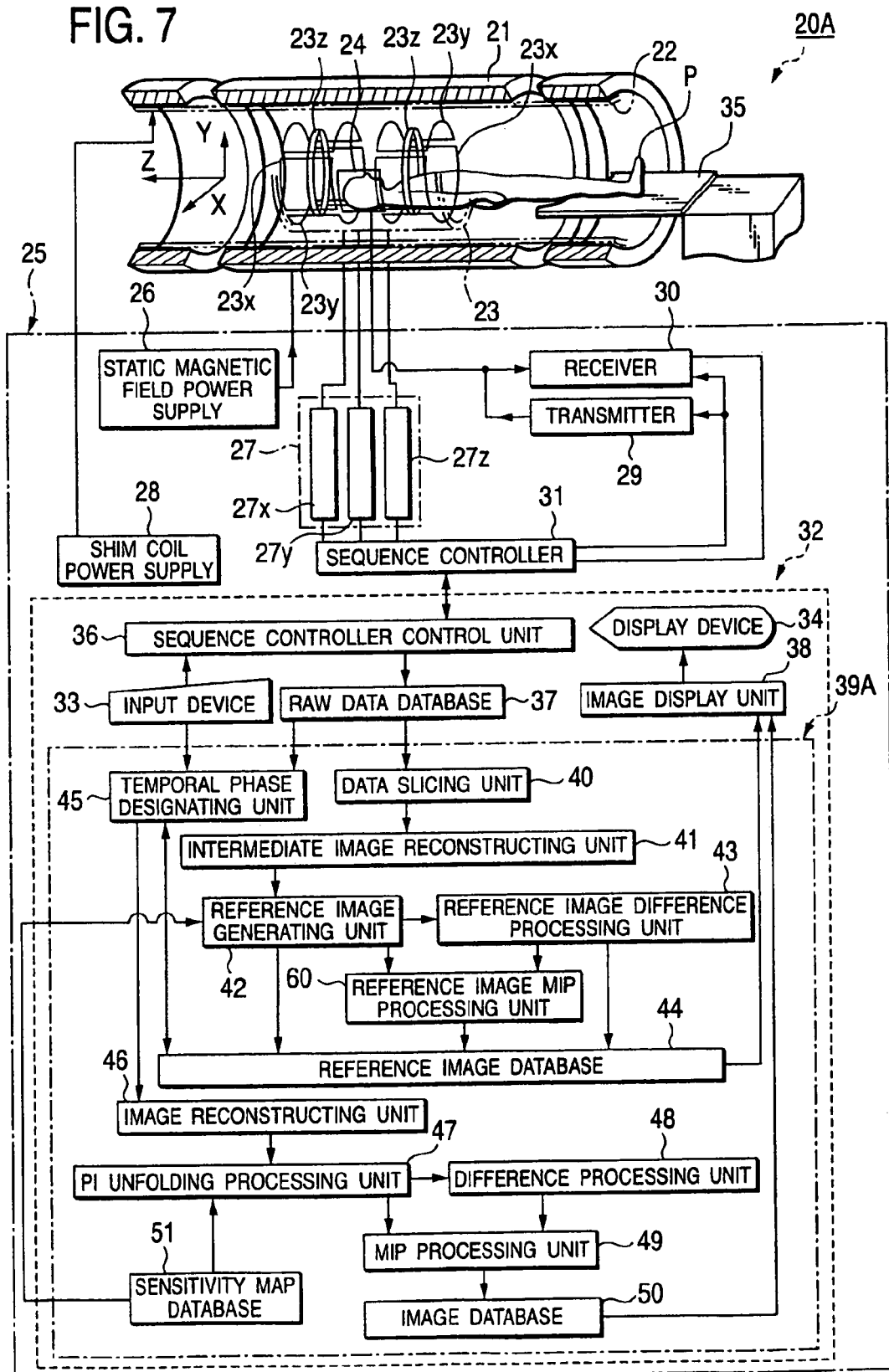
FIG. 7 is a functional block diagram showing a second embodiment of the magnetic resonance imaging apparatus.

FIG. 7 is a functional block diagram showing a second embodiment of the magnetic resonance imaging apparatus in accordance with the invention.

An MRI apparatus 20A shown in FIG. 2 is different from the MRI apparatus 20 shown in FIG. 1 in that the reference image MIP processing unit 49 is provided in a PI collection signal processing system 39A and in detailed functions of respective components of the PI collection signal processing system 39A. Since other components and actions are not substantially different from those in the MRI apparatus 20 shown in FIG. 1, the identical components are denoted by the same reference numerals and signs, and explanations of the components are omitted.

The PI collection signal processing system 39A of the MRI apparatus 20A includes the data slicing unit 40, the intermediate image reconstructing unit 41, the reference image generating unit 42, the reference image subtraction processing unit 43, the reference image database 44, the temporal phase designating unit 45, the image reconstructing unit 46, the PI unfolding processing unit 47, the subtraction processing unit 48, the MIP processing unit 49, the image database 50, the sensitivity map database 51, and a reference image MIP processing unit 60.

The data slicing unit 40 has a function of slicing plural 2D data in an arbitrary slice as an example of partial data from the raw data arranged as 3D volume data in the K space of the raw data database 37 and a function of giving the sliced plural 2D data to the intermediate image reconstructing unit 41.

The intermediate image reconstructing unit 41 has a function of executing 3D-FT, which is reconstruction processing, for the plural 2D data received from the data slicing unit 40 to thereby reconstruct 3D intermediate images of the patient P for respective coils as an example of intermediate images and a function of giving the respective obtained 3D intermediate images to the reference image generating unit 42.

The reference image generating unit 42 has a function of executing the PI unfolding processing for the 3D intermediate images received from the intermediate image reconstructing unit 41 to thereby generate 3D reference images as reference images and a function of giving 3D reference images, which are the respective 3D intermediate images after the PI unfolding processing, to the reference image subtraction processing unit 43 and the reference image MIP processing unit 60 and writing the 3D reference images in the reference image database 44. In this case, the PI unfolding processing unit 47 is adapted to slice sensitivity map data corresponding to the respective 3D intermediate images from the sensitivity map data stored in the sensitivity map database 51 as sensitivity map data for unfolding processing and use the sensitivity map data for the PI unfolding processing. As the sensitivity map data for unfolding processing corresponding to the 3D intermediate images, for example, it is possible to use sensitivity map data corresponding to respective 3D-FT slice surface of the 3D intermediate images.

The reference image subtraction processing unit 43 has a function of, with a 3D reference image in a predetermined temporal phase among the 3D reference images received from the reference image generating unit 42 as a 3D parent reference image, executing the subtraction processing for the 3D reference images in temporal phases later than that of the 3D parent image to thereby obtain 3D subtraction reference images and a function of giving the obtained 3D subtraction reference images to the reference image MIP processing unit 60 and writing the obtained 3D subtraction reference images in the reference image database 44.

The reference image MIP processing unit 60 has a function of applying the MIP processing to the 3D reference images received from the reference image generating unit 42 and the 3D subtraction reference images received from the reference image subtraction processing unit 43 to there by obtain MIP images and a function of writing the obtained respective MIP images in the reference image database 44.

The 3D reference images generated by the reference image generating unit 42, the 3D subtraction reference images generated by the reference image subtraction processing unit 43, and the MIP images generated by the reference image MIP processing unit 60 are accumulated in the reference image database 44.

The temporal phase designating unit 45 has a function of receiving designation information for the 3D reference images, the 3D subtraction reference image, or the MIP images from the input device 33 and referring to the 3D reference images, the 3D subtraction reference images, or the MIP images stored in the reference image database 44 to thereby extract raw data in designated temporal phases, which are temporal phases of the designated 3D reference images, the 3D subtraction reference images, or the MIP images, from the raw data database 37 and give the raw data to the image reconstructing unit 46.

However, the temporal phase designating unit 45 may be provided with a function of receiving temporal phase designation information from the input device 33 and extracting raw data in respective designated temporal phases from the raw data database 37.

The image reconstructing unit 46, the PI unfolding processing unit 47, the subtraction processing unit 48, and the MIP processing unit 49 have functions equivalent to those of the image reconstructing unit 46, the PI unfolding processing unit 47, the subtraction processing unit 48, and the MIP processing unit 49 of the PI collection signal processing system 39 shown in FIG. 1. Information of 3D images, sensitivity map data, and the like, which is the same as that in the image database 50 and the sensitivity map database 51 of the PI collection signal processing system 39 shown in FIG. 1, is stored in the image database 50 and the sensitivity map database 51, respectively.

Figure 8:
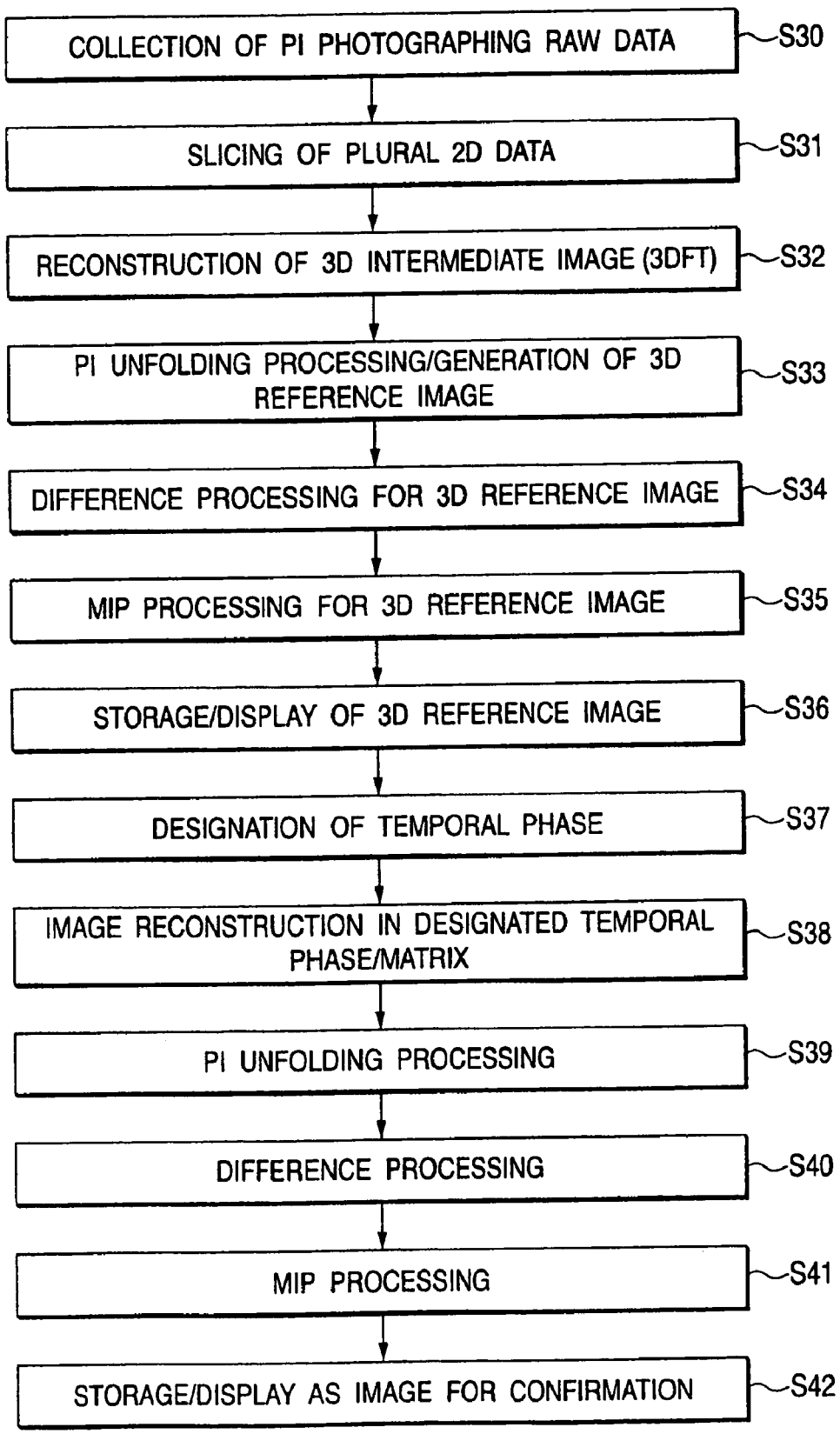
FIG. 8 is a flowchart showing a procedure in the case in which tomographic images of a patient P according to the PI method are picked up by the MRI apparatus shown in FIG. 7.
Figure 9:
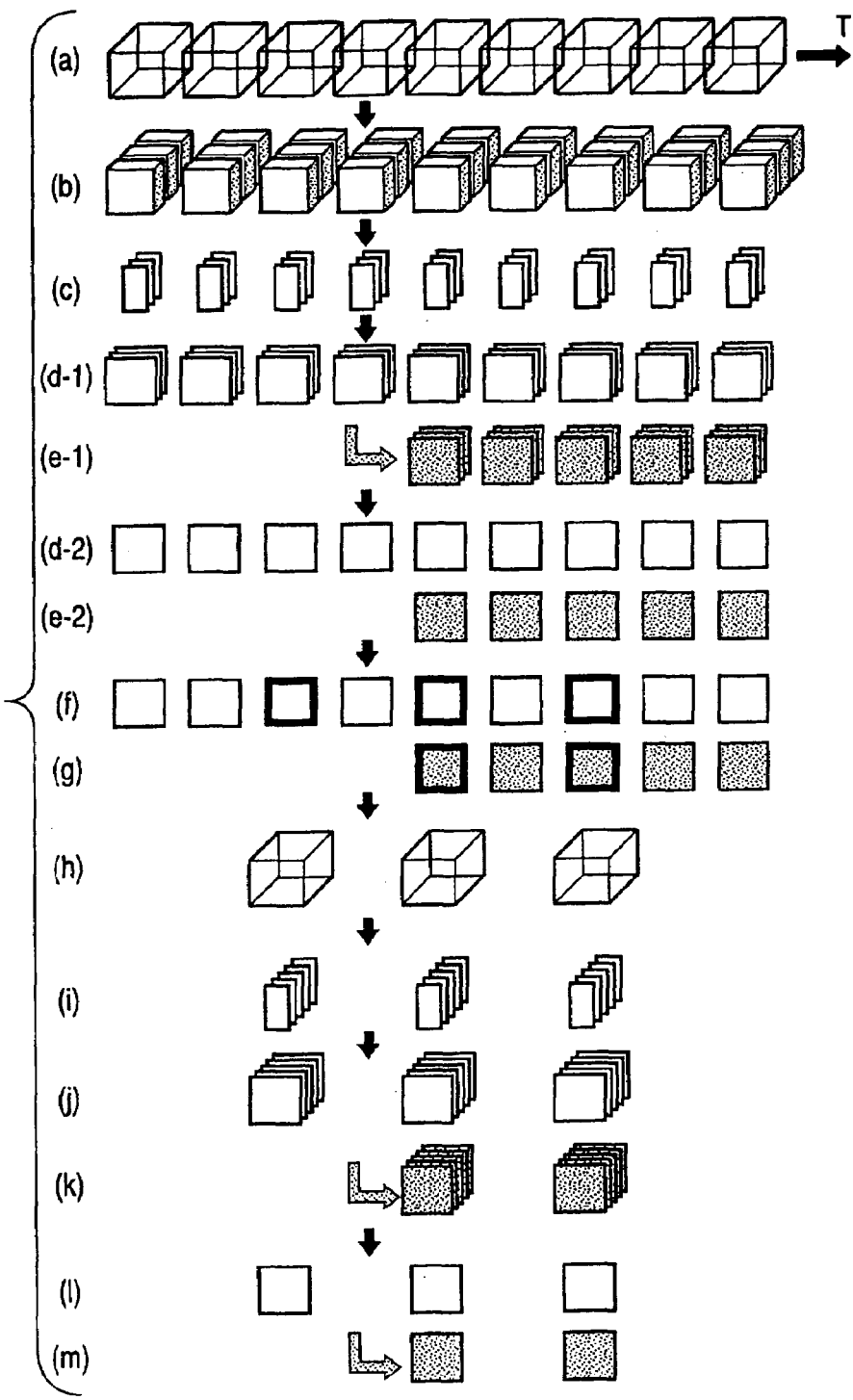
FIG. 9 is a diagram showing data obtained by the respective kinds of processing of the PI method shown in FIG. 8.

FIG. 8 is a flowchart showing a procedure at the time when a tomographic image of the patient P according to the PI method is picked up by the MRI apparatus 20A shown in FIG. 7. In the figure, numerals attached with a character S indicate respective steps of the flowchart. FIG. 9 is a diagram showing data obtained by respective kinds of processing of the PI method shown in FIG. 8.

Next, an operation of the MRI apparatus 20A will be explained.

First, in step S30, the dynamic imaging according to the contrast MRA method is performed in accordance with a PI sequence, and raw data in respective temporal phases are sequentially arranged as 3D volume data in the K space formed in the raw data database 12 as shown in FIG. 9A.

Next, in step S31, the data slicing unit 40 slices 2D data included in matrixes fewer than matrixes designated as a reconstruction range, for example, 2D data included in matrixes of a small number near the K space as shown in FIG. 9B from the raw data in the respective temporal phases arranged in the K space of the raw data database 37 as 3D volume data, respectively, and sequentially gives the sliced plural 2D data in the respective temporal phases to the intermediate image reconstructing unit 41.

Next, in step S32, the intermediate image reconstructing unit 41 sequentially executes the 3D-FT for the plural 2D data in the respective temporal phases received from the data slicing unit 40 to thereby reconstruct 3D intermediate images of the patient P as shown in FIG. 9C and gives the obtained respective 3D intermediate images to the reference image generating unit 42.

Next, in step S33, the reference image generating unit 42 sequentially executes the PI unfolding processing for the 3D intermediate images in the respective temporal phases received from the intermediate image reconstructing unit 41 to thereby generate 3D reference images as shown in FIG. 9D-1. In this case, the PI unfolding processing unit 47 slices, for example, sensitivity map data corresponding to respective 3D0FT slice surfaces of the 3D intermediate image from the sensitivity map data stored in the sensitivity map database 51 as sensitivity map data for unfolding processing and uses the sensitivity map data for the PI unfolding processing.

Then, the reference image generating unit 42 sequentially writes the 3D reference images in the reference image database 44 and, when subtraction images and MIP images are necessary, sequentially gives the 3D reference images in the reference image subtraction processing unit 43 and the reference image MIP processing unit 60.

Next, in step S34, when the reference image subtraction processing unit 43 receives the 3D reference images from the reference image generating unit 42, with a 3D reference image in a predetermined temporal phase, for example, a temporal phase before injection of a contrast medium as a 3D parent reference image, the reference image subtraction processing unit 43 executes the subtraction processing for the 3D reference images in temporal phases after the injection of the contrast agent with temporal phases later than that of the 3D parent reference image to thereby generate 3D subtraction reference images as shown in FIG. 9E-1. Moreover, the reference image subtraction processing unit 43 writes the generated 3D subtraction reference images in the reference image database 44 and, when MIP images are necessary, sequentially gives the 3D subtraction reference images to the reference image MIP processing unit 60.

Next, in step S35, when the reference image MIP processing unit 60 receives the respective 3D reference images after the PI unfolding processing from the reference image generating unit 42 or receives the 3D subtraction reference images from the reference image subtraction processing unit 43, the reference image MIP processing unit 60 sequentially performs the MIP processing to thereby obtain MIP images of the 3D reference images shown in FIG. 9D-2 or MIP images of the 3D subtraction reference images shown in FIG. 9E-2, respectively, and writes the MIP images in the reference image database 44.

As a result, in step S36, the 3D reference images, the 3D difference reference images, or the MIP images are sequentially stored in the reference image database 44. Then, the image display unit 38 sequentially gives the 3D reference images, the 3D subtraction reference images, or the MIP images in time series to the display device 34 and causes the display device 34 to display the images on a real time basis.

Therefore, the operator can judge propriety of the dynamic imaging according to the contrast MRA method and observe movement of a contrast medium by confirming the respective 3D reference images, the 3D subtraction reference images, or the MIP images on a real time basis.

In addition, the operator can designate temporal phases in which it is necessary to reconstruct the 3D images from the respective 3D reference images, 3D subtraction reference images, or MIP images in the respective temporal phases.

Thus, in step S37, the operator gives designation information for the 3D reference images, the 3D subtraction reference images, or the MIP image to the temporal phase designating unit 45 from the input device 33. The temporal phase designating unit 45 refers to the reference image database 44 to thereby specify temporal phases of MIP images of the 3D reference images or MIP images of the 3D subtraction reference images indicated by, for example, bold line frames as shown in FIG. 9F or FIG. 9G. With the specified temporal phases as designated temporal phases, the temporal phase designating unit 45 extracts 3D volume data (raw data) in the designated temporal phases from the raw data database 37 as shown in FIG. 9H and gives the 3D volume data to the image reconstructing unit 46.

Moreover, in steps S38 to S42, as in steps S17 to S21 in FIG. 3, the 3D images shown in FIG. 9I, the respective 3D images after the PI unfolding processing shown in FIG. 9J, the 3D subtraction images shown in FIG. 9K, the MIP images of the 3D images shown in FIG. 9L, and the MIP images of the 3D subtraction images shown in FIG. 9M are generated only for temporal phases necessary for diagnosis by the image reconstructing unit 46, the PI unfolding processing unit 47, the subtraction processing unit 48, and the MIP processing unit 49, respectively, and accumulated in the image database 50.

Then, the 3D images, the 3D subtraction images, and the MIP images stored in the image database 50 are given to the display device 34 and displayed on a real time basis by the image display unit. The operator can confirm the 3D images, the 3D subtraction images, or the MIP images and perform diagnosis for the patient P earlier.

According to the MRI apparatus 20A described above, in addition to the same effects as the MRI apparatus 20 shown in FIG. 1, even in the case in which it is difficult to judge propriety of imaging or in the case in which it is difficult to observe movement of a contrast medium with the 2D reference images or the 2D subtraction reference images, it is possible to judge propriety of imaging or observe movement of a contrast agent with the 3D reference images, the 3D subtraction reference images, or the MIP images.

Figure 10:
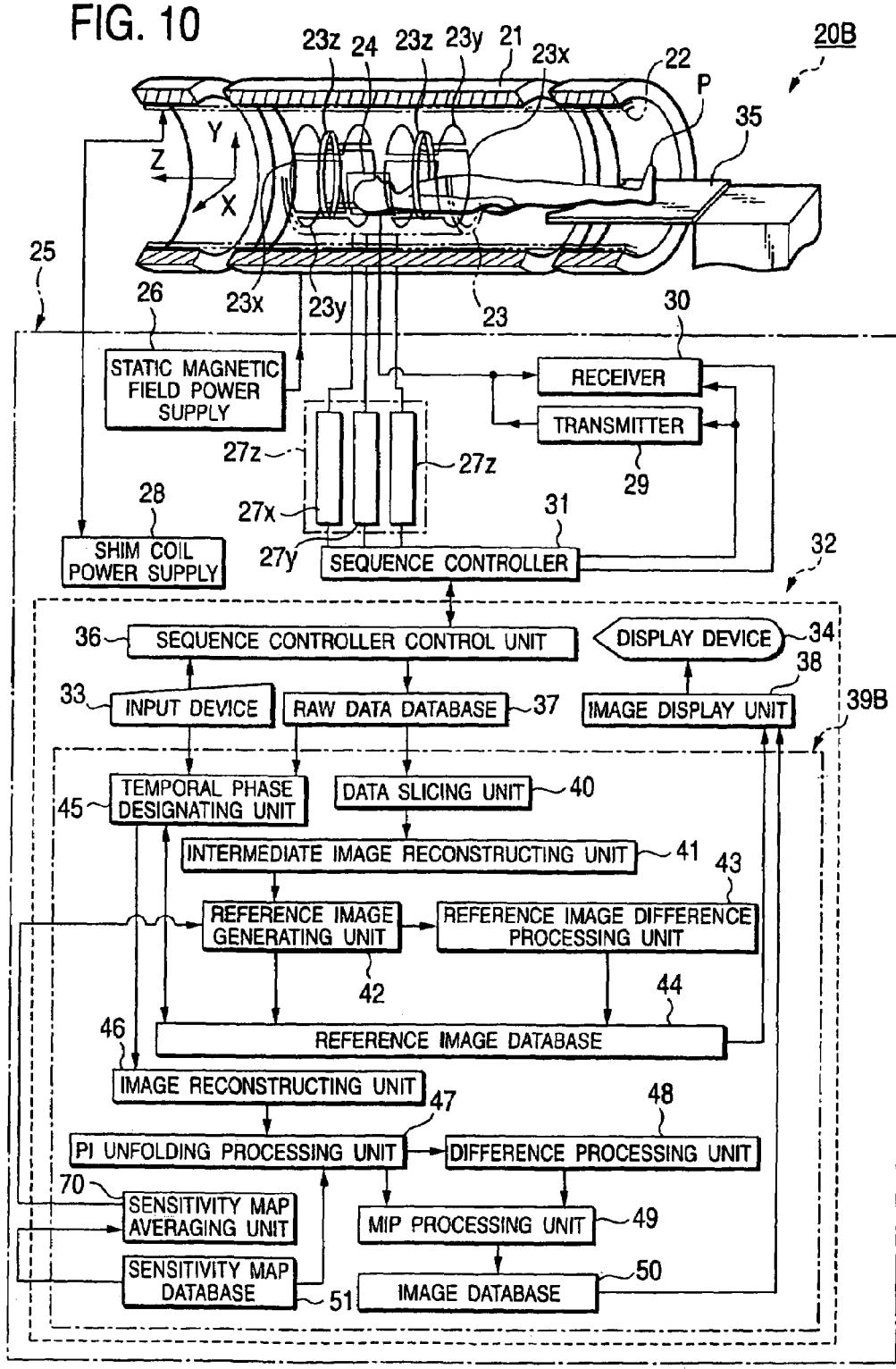
FIG. 10 is a functional block diagram showing a third embodiment of the magnetic resonance imaging apparatus.

FIG. 10 is a functional block diagram showing a third embodiment of the magnetic resonance imaging apparatus in accordance with the invention.

An MRI apparatus 20B shown in FIG. 10 is different from the MRI apparatus 20 shown in FIG. 1 in that a sensitivity map averaging unit 70 is provided in the PI collection signal processing system 39B. Since other components and actions are not substantially different from those of the MRI apparatus 20 shown in FIG. 1, the identical components are denoted by the same reference numerals and signs, and only functions and actions of the sensitivity map averaging unit 70 will be explained.

The sensitivity map averaging unit 70 has a function of slicing plural sensitivity map data in ranges corresponding to intermediate images from the sensitivity map database 51 and executing averaging processing in a slice direction to thereby generate sensitivity map data for unfolding processing and a function of giving the generated sensitivity map data for unfolding processing to the reference image generating unit 42. As the sensitivity map data in the range corresponding to the 2D intermediate images, for example, all sensitivity map data included in a 2D-FT slab in the 2D intermediate images can be used. Alternatively, a required range is set in the slice direction from a center position of the 2D-FT slab, and sensitivity map data included in the set range can be used.

Therefore, the reference image generating unit 42 is adapted to, when the PI unfolding processing for the 2D intermediate images is performed, use the sensitivity map data for unfolding processing that is sensitivity map data after the averaging processing generated by the sensitivity map averaging unit.

Next, an operation of the MRI apparatus 20B will be explained.

Figure 11:
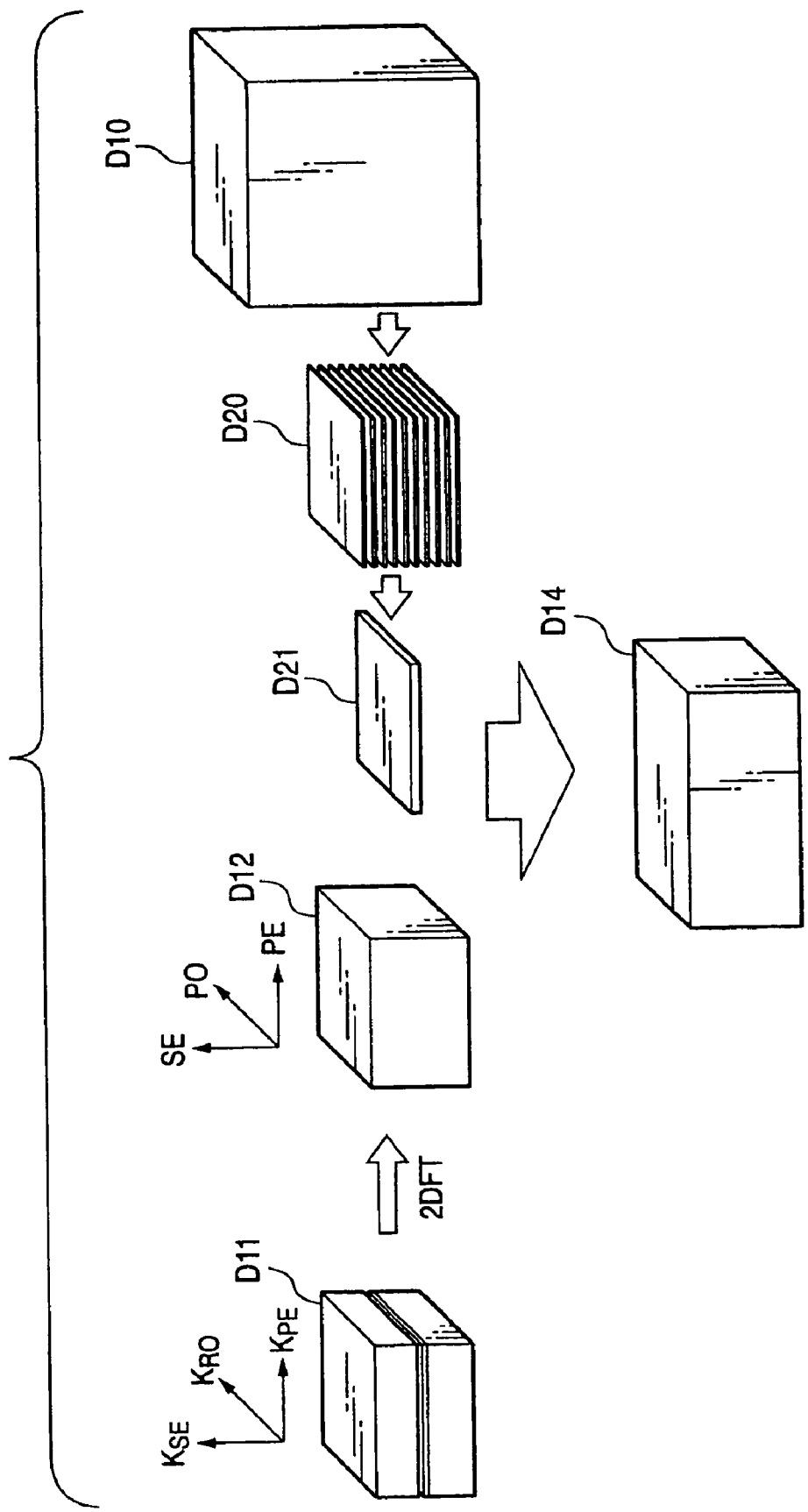
FIG. 11 is a conceptual diagram showing a procedure of PI unfolding processing for 2D intermediate images by the MRI apparatus shown in FIG. 10.
Figure 12:
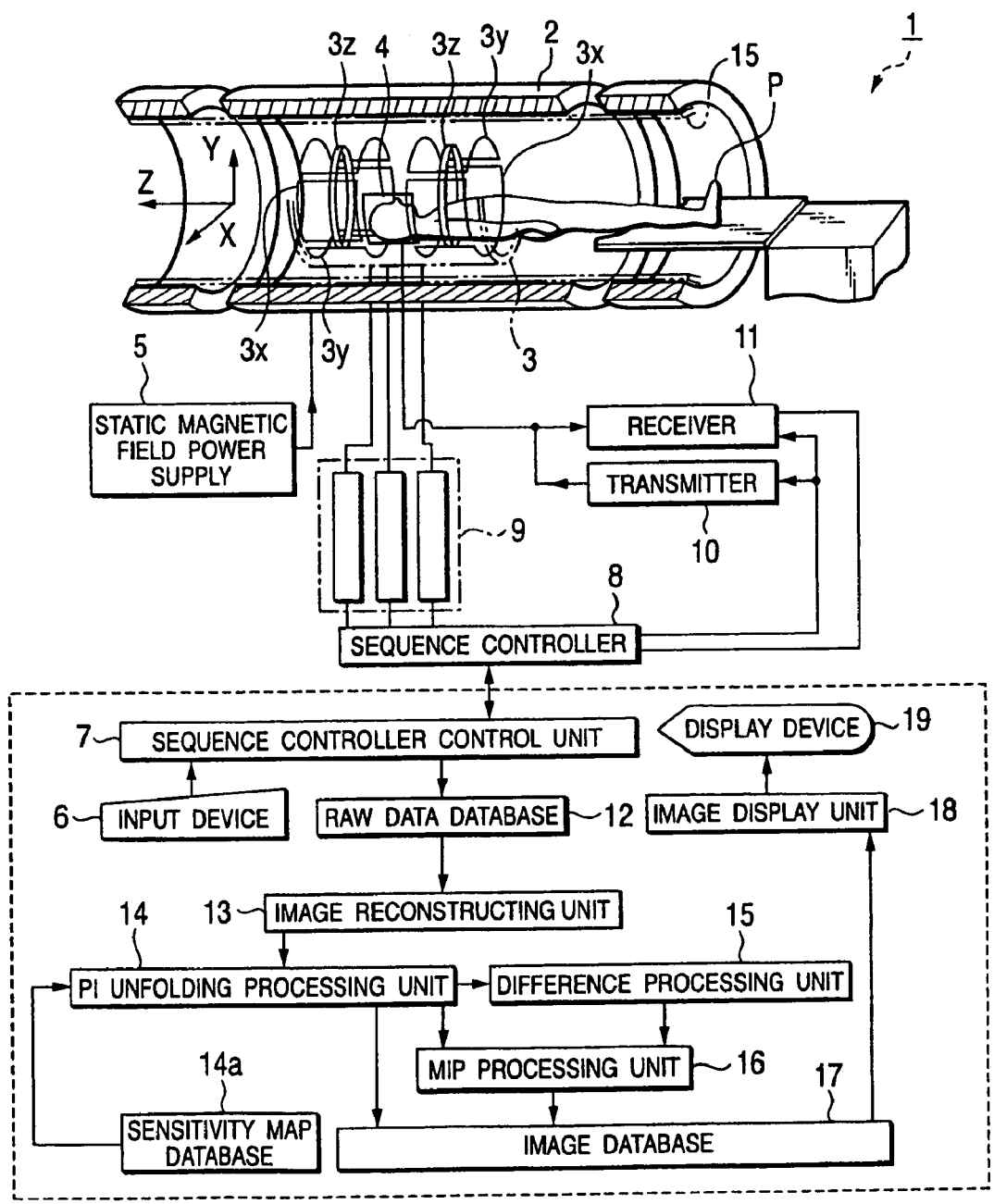
FIG. 12 is a functional block diagram of a conventional MRI apparatus.
Figure 13:
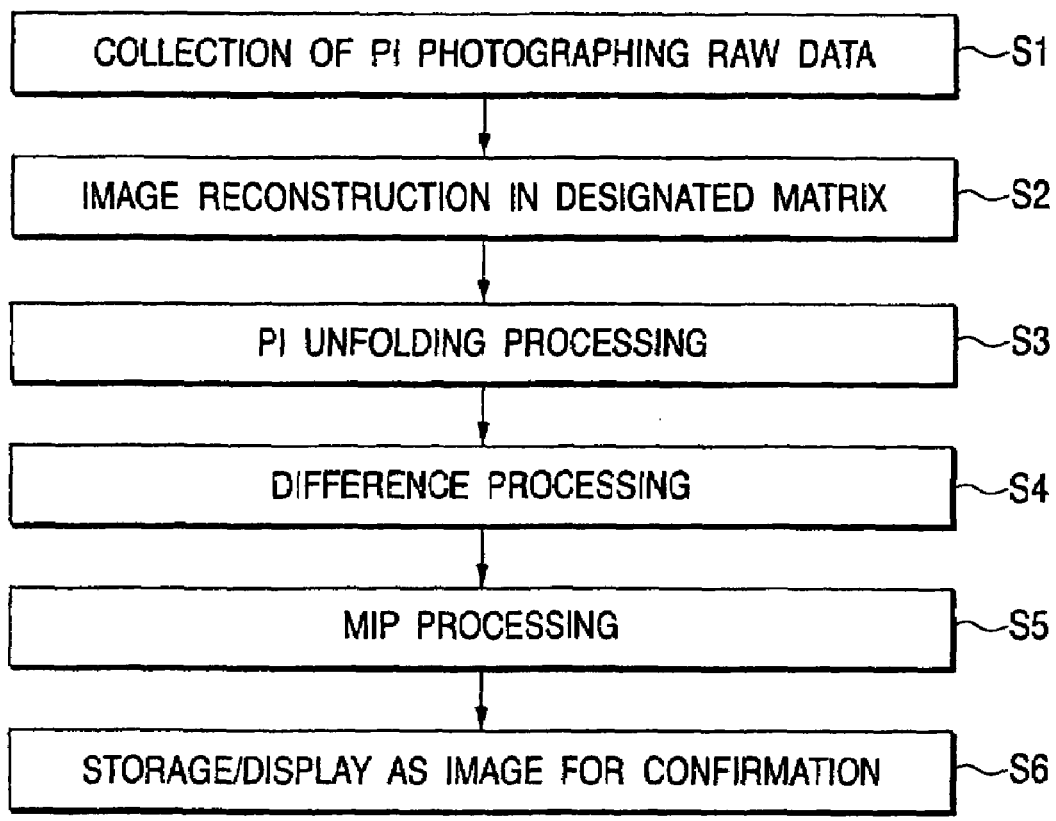
FIG. 13 is a flowchart showing a procedure of image processing according to a conventional PI method.
Figure 14:
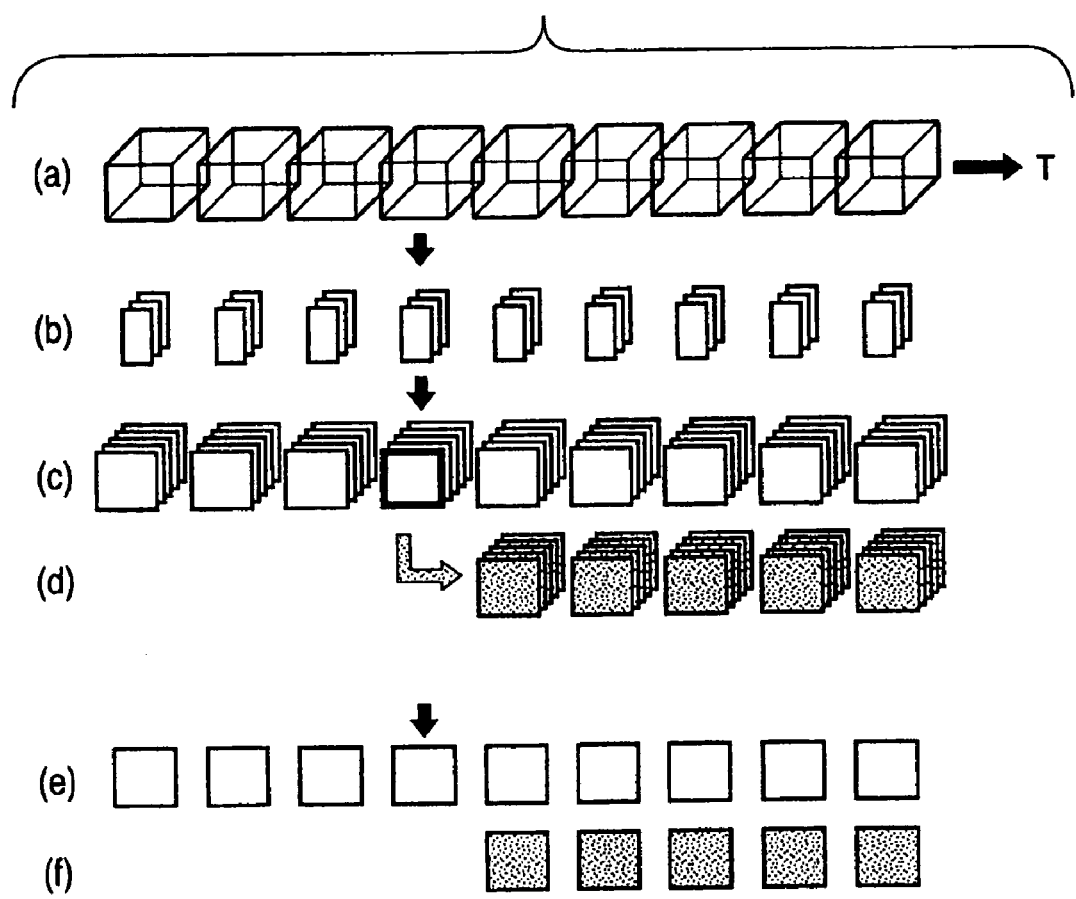
FIG. 14 is a diagram showing data obtained by respective kinds of processing of the conventional PI method shown in FIG. 13.
Figure 15:
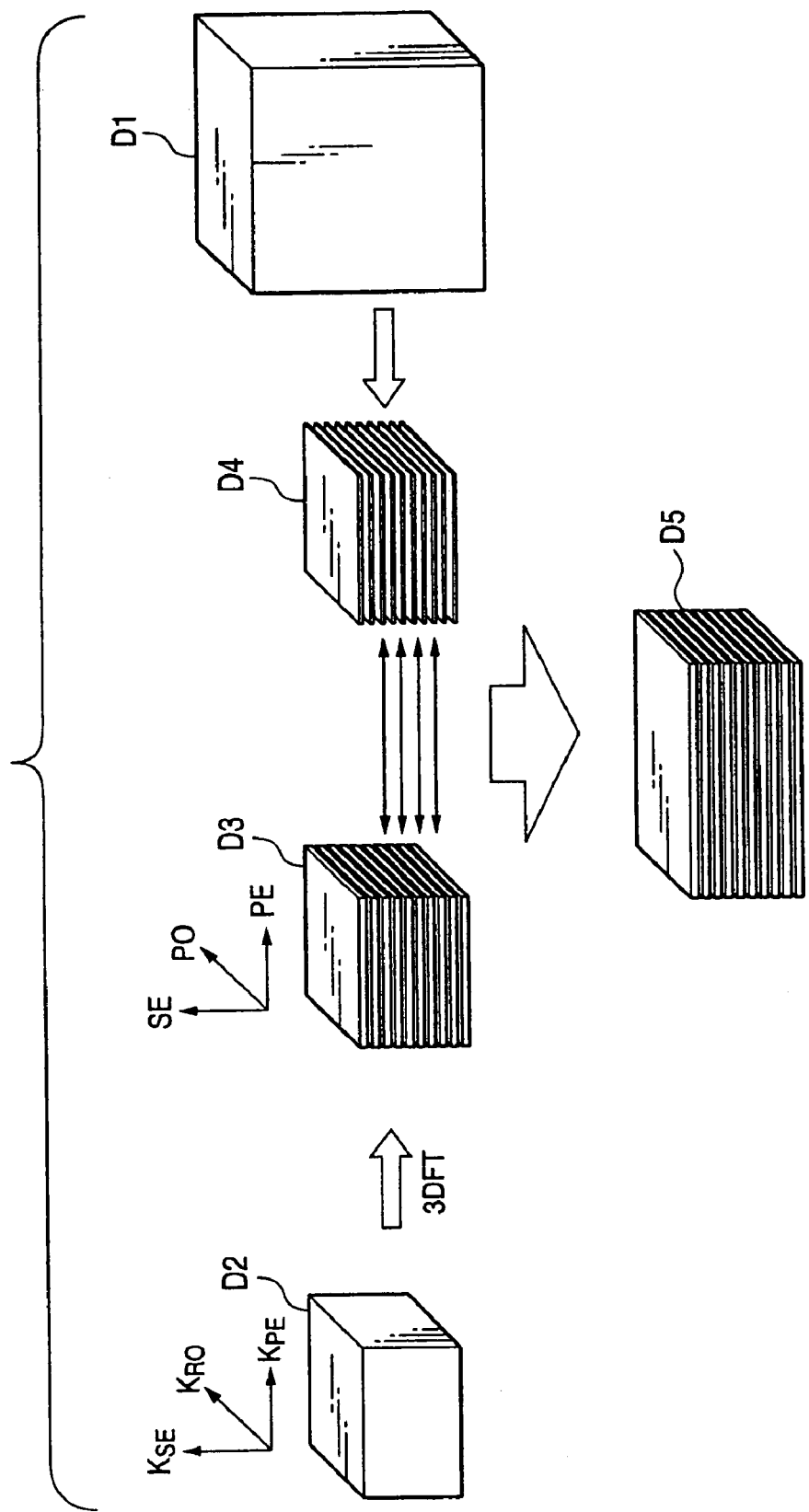
FIG. 15 is a conceptual diagram showing a procedure of conventional PI unfolding processing shown in FIG. 13.

FIG. 11 is a conceptual diagram showing a procedure of the PI unfolding processing for the 2D intermediate images by the MRI apparatus 20B shown in FIG. 10. Note that, in FIG. 11, data same as those in FIG. 5 are denoted by the same reference signs.

In the MRI apparatus 20B, the sensitivity map averaging unit 70 slices, for example, all sensitivity map data D20 included in a 2D-FT slab in the 2D intermediate image D12 among the sensitivity map data D10 stored in the sensitivity map database 51. Next, the sensitivity map averaging unit 70 executes the averaging processing for the sliced sensitivity map data D20 in the slice direction. As a result, sensitivity map data D21 after the averaging processing is obtained as sensitivity map data for unfolding processing, and the sensitivity map averaging unit 70 gives the obtained sensitivity map data for unfolding processing, which is the sensitivity map data D21 after the averaging processing, to the reference image generating unit 42.

Therefore, the sensitivity map data for unfolding processing, which is the sensitivity map data D21 after the averaging processing, are used for the PI unfolding processing for the 2D intermediate image by the reference image generating unit 42.

According to the MRI apparatus 20B described above, in addition to the same effects as the MRI apparatus 20 shown in FIG. 1, it is possible to maintain accuracy of the PI unfolding processing even if a slab is very thick (e.g., about 10 cm). As a slab becomes thicker, a difference of sensitivity map data of the multi-coil between an upper part and a lower part of the slab increases. Thus, when the PI unfolding processing is executed using the sensitivity map data in a center position of the slab, an error increases and accuracy becomes insufficient.

However, in the MRI apparatus 20B, since the sensitivity map data of the entire slab is averaged, it is possible to control the decline in accuracy of reference images.

The MRI apparatuses 20, 20A, and 20B in the respective embodiments may be combined. For example, it is also possible that 2D reference images are generated for part of temporal phases and 3D reference images are generated for the other temporal phases or both 2D reference images and 3D reference images are generated. Alternatively, it is also possible that the sensitivity map averaging unit 70 is provided in the MRI apparatus 20A to execute the averaging processing for sensitivity map data included in respective slices of 3D intermediate images after the 3D-FT, respectively, in a slice direction.

In addition, part of the units, databases, and the like in the MRI apparatuses 20, 20A, and 20B may be removed or combined. For example, although the intermediate image reconstructing unit 41 and the image reconstructing unit 46 are described separately in the embodiments, one reconstructing unit may include the functions of both the units. In addition, the same holds true for the reference image subtraction processing unit 43 and the subtraction processing unit 48 or the reference image generating unit 42 and the PI unfolding processing unit 47.

Moreover, it is also possible to use the MRI apparatuses 20, 20A, and 20B not only for the dynamic imaging but also for the usual PI method for a single temporal phase.

What is claimed is:

1. A magnetic resonance imaging apparatus capable, of quickly providing intermediate reference images from collected PI MRI data to confirm the propriety of the collected PI MRI data without requiring final PI MRI reconstruction processes, said apparatus comprising:
    a three dimensional sensitivity map database that stores previously collected sensitivity map data of a PI MRI multi-coil including plural coils for unfolding processing of PI MRI data;
    a data slice unit that provides partial data representing a slice extracted from collected PI MRI three-dimensional volume data collected by said coils;
    an intermediate image reconstruction unit that reconstructs an intermediate image from the partial data including PI aliasing; and
    a reference image generation unit that provides sensitivity map data representing a slice corresponding to the intermediate image extracted from the sensitivity map database, executes parallel imaging unfolding processing for the intermediate image using the extracted sensitivity map data, and generates a respectively corresponding unfolded reference image which may be used to evaluate the appropriateness of the more extensive collected volume data set for a desired result.

2. A magnetic resonance imaging apparatus according to claim 1, wherein
    the data slice unit extracts two-dimensional data as the partial data, and
    the reference image generation unit generates two-dimensional reference image.

3. A magnetic resonance imaging apparatus according to claim 2, wherein
    the data slice unit extracts two-dimensional data not including a center of K space as the partial data.

4. A magnetic resonance imaging apparatus according to claim 1, wherein
    the data slice unit extracts plural two-dimensional data as the partial data sets, and
    the reference image generation unit generates three-dimensional reference images as the reference images.

5. A magnetic resonance imaging apparatus according to claim 1, further comprising:
    a subtraction processing unit that subtracts a reference image in a predetermined temporal phase from a reference image in a later temporal phase.

6. A magnetic resonance imaging apparatus according to claim 1, further comprising:
    a subtraction processing unit that subtracts a reference image in a temporal phase before injection of a contrast agent from a reference image in a temporal phase after the injection of the contrast agent.

7. A magnetic resonance imaging apparatus according to claim 4, further comprising:
    a reference image MIP process unit that applies MIP processing to three-dimensional reference images to obtain an MIP images.

8. A magnetic resonance imaging apparatus according to claim 1, further comprising:

a temporal phase designation unit that designates a predetermined temporal phase for extracting three-dimensional volume data;
    an image reconstruction unit that reconstructs three-dimensional images from the three-dimensional volume data in the designated temporal phases; and
    a parallel imaging unfolding process unit that executes parallel imaging unfolding processing for three-dimensional images in the designated temporal phases received from the image reconstruction unit.

9. A magnetic resonance imaging apparatus according to claim 8, further comprising:
    a subtraction process unit that subtracts a three-dimensional image in a predetermined temporal phase from a three-dimensional image in later temporal phase among the three-dimensional images after parallel imaging unfolding processing.

10. A magnetic resonance imaging apparatus according to claim 8, further comprising:
    an MIP process unit that applies MIP processing to three-dimensional images after parallel imaging unfolding processing.

11. A magnetic resonance imaging apparatus according to claim 1, further comprising:
    a sensitivity map averaging unit that extracts plural sensitivity map data in slice ranges corresponding to intermediate images from the sensitivity map database and executes averaging processing in a slice direction to generate sensitivity map data for unfolding processing,
    wherein the reference image generation unit executes parallel imaging unfolding processing using sensitivity map data generated by the sensitivity map averaging unit.

12. A magnetic resonance imaging apparatus according to claim 1, further comprising:
    a display device that displays the reference images on a real time basis,
    wherein the reference image generation unit generates reference images after data collection of an arbitrary temporal phase is completed during a parallel imaging sequence of MRI data collection.

13. A processing method for magnetic resonance imaging collection data capable, of quickly providing intermediate reference images from collected PI MRI data to confirm the propriety of the collected PI MRI data without requiring final PI MRI reconstruction processes, said apparatus method comprising:
    extracting partial data from three-dimensional volume data collected for respective coils of a PI MRI multi-coil including plural coils;
    reconstructing at least one intermediate image from the partial data which include PI aliasing;
    extracting sensitivity map data corresponding to the intermediate image from previously collected sensitivity map data of the multi-coil necessary for parallel imaging unfolding processing as sensitivity map data for unfolding processing, and
    executing parallel imaging unfolding processing for the intermediate image using the extracted sensitivity map data to thereby generate a respectively corresponding unfolded reference image which may be used to evaluate the appropriateness of the more extensive collected volume data set for a desired result.

14. A processing method for magnetic resonance imaging collection data according to claim 13, wherein:

in extracting of partial data, two-dimensional data is extracted as the partial data, and in the generating of a reference image, a two-dimensional reference image is generated as the reference images.

15. A processing method for magnetic resonance imaging collection data according to claim 14, wherein:

in extracting partial data, two-dimensional data not including a center of K space is extracted as the partial data.

16. A processing method for magnetic resonance imaging collection data according to claim 13, wherein:

in extracting partial data, plural two-dimensional data sets are extracted as the partial data, and in generating a reference image, a three-dimensional reference image is generated.

17. A processing method for magnetic resonance imaging collection data according to claim 13, further comprising:

subtracting a reference image in a predetermined temporal phase from a reference image in later temporal phase.

18. A processing method for magnetic resonance imaging collection data according to claim 13, further comprising:

subtracting a reference image in a temporal phase before imaging a contrast medium from a reference image in a temporal phase after imaging the contrast medium.

19. A processing method for magnetic resonance imaging collection data according to claim 18, further comprising:

applying reference image MIP processing to plural reference images to obtain MIP images.

20. A processing method for magnetic resonance imaging collection data according to claim 13, further comprising:

designating a predetermined temporal phase for extracting three-dimensional volume data;

reconstructing three-dimensional images from the three-dimensional volume data in the designated temporal phases; and executing parallel imaging unfolding processing for the three-dimensional images in the designated temporal phases received from the image reconstruction unit.

21. A processing method for magnetic resonance imaging collection data according to claim 20, further comprising:

subtracting a three-dimensional image in a predetermined phase from a three-dimensional image in later temporal phase among the three-dimensional images after parallel imaging unfolding processing.

22. A processing method for magnetic resonance imaging collection data according to claim 20, further comprising:

applying MIP processing to a three-dimensional image after parallel imaging processing.

23. A processing method for magnetic resonance imaging collection data according to claim 13, further comprising:

extracting plural sensitivity map data in slice ranges corresponding to intermediate images from the sensitivity map database and executing averaging processing in a slice direction to generate sensitivity map data for unfolding processing, wherein in generating reference images, parallel imaging unfolding processing is executed using sensitivity map data generated by the sensitivity map averaging unit.

24. A processing method for magnetic resonance imaging collection data according to claim 13, further comprising:

displaying reference images on a real time basis, wherein the reference images are generated after data collection of an arbitrary temporal phase is completed during a PI MRI imaging sequence.

25. A magnetic resonance imaging apparatus capable, of quickly providing intermediate reference images from collected PI MRI data to confirm the propriety of the collected PI MRI data without requiring final PI MRI reconstruction processes, said apparatus comprising:

means for storing three-dimensional sensitivity map data of a multi-coil including plural coils for parallel imaging unfolding processing;

means for extracting partial data from three-dimensional PI MRI volume data collected for the respective coils;

means for reconstructing intermediate images from the partial data including PI aliasing; and means for extracting sensitivity map data corresponding to the intermediate images from the sensitivity map database, executing parallel imaging unfolding processing for the intermediate images using the extracting sensitivity map data, and generating respectively corresponding unfolded reference image which may be used to evaluate the appropriateness of the more extensive collected volume data set for a desired result.

* * * * *